(12) United States Patent
Dang et al.

(10) Patent No.: US 8,959,757 B2
(45) Date of Patent: Feb. 24, 2015

(54) METHOD OF MANUFACTURING AN ELECTRONIC MODULE

(75) Inventors: Thong Dang, Summerfield, NC (US); Mohsen Haji-Rahim, Chapel Hill, NC (US); Mark Charles Held, High Point, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 235 days.

(21) Appl. No.: 13/339,817

(22) Filed: Dec. 29, 2011

(65) Prior Publication Data

US 2013/0170147 A1     Jul. 4, 2013

(51) Int. Cl.
*H05K 3/30*     (2006.01)

(52) U.S. Cl.
USPC .................. 29/832; 29/825; 29/840; 29/846

(58) Field of Classification Search
USPC .............................. 29/825, 830, 832, 840, 846
See application file for complete search history.

(56) References Cited

U.S. PATENT DOCUMENTS

| | | | | |
|---|---|---|---|---|
| 6,495,914 B1* | 12/2002 | Sekine et al. | ................. | 257/723 |
| 2010/0244208 A1* | 9/2010 | Pagaila et al. | ................. | 257/659 |
| 2010/0270661 A1* | 10/2010 | Pagaila et al. | ................. | 257/659 |
| 2011/0215450 A1* | 9/2011 | Chi et al. | ...................... | 257/660 |

OTHER PUBLICATIONS

Hunt, J. "Evolving high density packaging for mobile applications," Semicon West 2008, Jul. 15, 2007, pp. 28-31.
Unknown Author, "Redistributed chip package (RCP) technology: freescale semiconductor," Freescale Semiconductor, Inc., 2005, 6 pages.

* cited by examiner

*Primary Examiner* — Carl Arbes
(74) *Attorney, Agent, or Firm* — Withrow & Terranova, P.L.L.C.

(57) ABSTRACT

In one embodiment, a shielded electronic module is formed on a substrate. The substrate has a component area and one or more electronic components attached to the component area. One set of conductive pads may be attached to the component area and another set of conductive pads may be provided on the electronic component. The conductive pads on the component area are electrically coupled to the conductive pads of the electronic component by a conductive layer. A first insulating layer is provided over the component area and underneath the conductive layer that may insulate the electronic component and the substrate from the conductive layer. A second insulating layer is provided over the first insulating layer that covers at least the conductive layer. In this manner, the conductive layer is isolated from an electromagnetic shield formed over the component area.

21 Claims, 47 Drawing Sheets

METHOD OF MANUFACTURING AN ELECTRONIC MODULE

FIELD OF THE DISCLOSURE

The present disclosure relates to electronic modules that have electromagnetic shields and methods of manufacturing the same.

BACKGROUND

Electronic components have become ubiquitous in modern society. The electronics industry routinely announces accelerated clocking speeds, higher transmission frequencies, and smaller integrated circuit modules. While there are a myriad of benefits to these devices, smaller electronic components that operate at higher frequencies also create problems. Higher operating frequencies mean shorter wavelengths, where shorter conductive elements within electronic circuitry may act as antennas to unintentionally broadcast electromagnetic emissions throughout the electromagnetic spectrum. If the signal strengths of the emissions are high enough, the emissions may interfere with the operation of an electronic component subjected to the emissions. Further, the Federal Communications Commission (FCC) and other regulatory agencies regulate these emissions, and as such, these emissions must be kept within regulatory requirements.

One way to reduce emissions is to form a shield around the modules. Typically, a shield is formed from a grounded conductive structure that covers a module or a portion thereof. When emissions from electronic components within the shield strike the interior surface of the shield, the electromagnetic emissions are electrically shorted through the grounded conductive structure that forms the shield, thereby reducing emissions. Likewise, when external emissions from outside the shield strike the exterior surface of the shield, a similar electrical short occurs, and the electronic components in the module do not experience the emissions.

Electronic components within these shielded electronic modules may be attached on a surface of a substrate. To form connections to electronic circuits within or outside of the shielded electronic module, the surface of the substrate may include conductive pads, which are wired within the substrate or on the substrate surface to provide the necessary connections. Wire bonds are often utilized to couple these electronic components to the conductive pads. Unfortunately, wire bonds extend above the electronic components and are spatially inefficient. Since wire bonds create electromagnetic emissions and may also be affected by external electromagnetic emissions, these wire bonds need to be shielded by the shielded electronic module as well. Thus, these wire bonds require an increase the size of the shielded electronic module. In particular, the wire bonds require an increase in the height of the electromagnetic shield above the substrate surface. However, it is often desirable that these shielded electronic modules be as small as possible to minimize the space consumed by the shielded electronic module. Thus, what is needed is a shielded electronic module that connects the electronic component to the conductive pads in a spatially efficient manner.

SUMMARY

The present disclosure includes embodiments of shielded electronic modules and methods of manufacturing the same. The shielded electronic modules may have one or more electronic components and one or more conductive pads on a surface of a substrate. The connections between the electronic components and conductive pads may be formed in a more spatially efficient manner thereby reducing the volume required by the shielded electronic module.

In one embodiment of manufacturing an exemplary shielded electronic module, an electronic component is attached on a component area on the surface of a substrate. The surface of the substrate has a first conductive pad and the electronic component has a second conductive pad. For example, the first conductive pad on the substrate surface may be configured to provide connections to other electronic circuits within or outside of the shielded electronic module. By connecting the first conductive pad on the surface of the substrate to the second conductive pad on the electronic component, the electronic component connects to the other electronic circuits. After attaching the electronic component to the component area, a first insulating layer is provided over the component area to cover the electronic component and the first conductive pad on the surface of the substrate. A section of the second conductive pad is then exposed through the first insulating layer. In this manner, the first insulating layer isolates the component area but allows for a connection between the first conductive pad on the surface of the substrate and the second conductive pad on the electronic component.

To couple the first conductive pad on the surface of the substrate to the second conductive pad on the electronic component, a conductive layer is formed over the first insulating layer. The conductive layer attaches to and extends between the section of the first conductive pad and the section of the second conductive pad exposed through the first insulating layer. The conductive layer may conform to the shape of the material over which it sits and thus may provide a spatially efficient connection between the first conductive pad and the second conductive pad. Next, a second insulating layer may be provided over the first insulating layer to cover the conductive layer. An electromagnetic shield material is then applied over the second insulating layer to form an electromagnetic shield that covers the component area. In this manner, the second insulating layer isolates the electromagnetic shield from the conductive layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 4A-4L illustrate steps associated with one embodiment of a method for manufacturing the first embodiment of the electronic module illustrated in FIG. 1.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
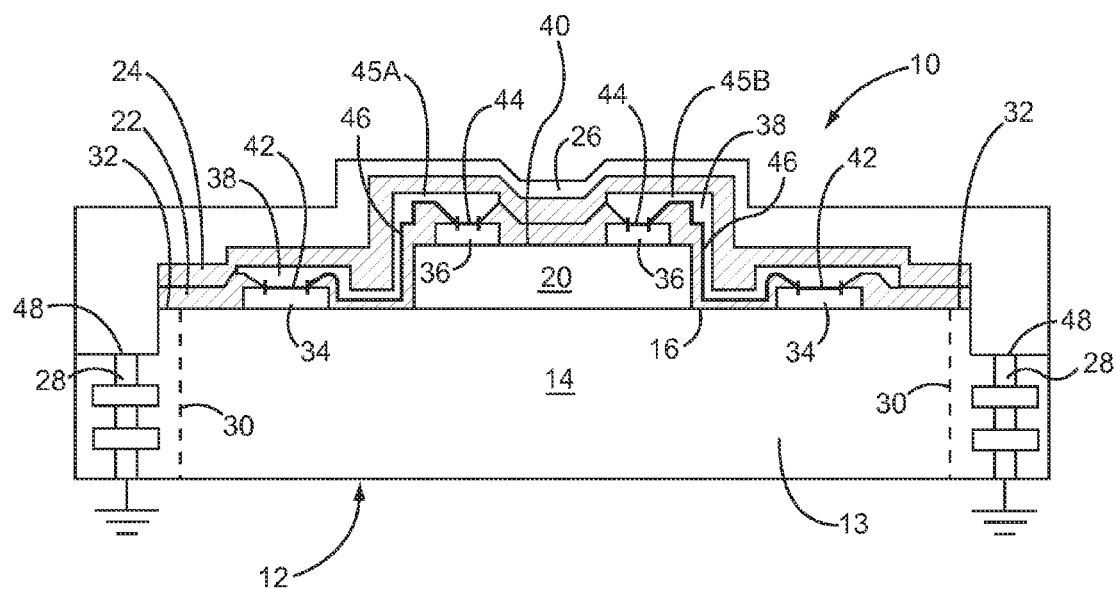
FIG. 1 illustrates a first embodiment of an electronic module in accordance with this disclosure.

The present disclosure relates to shielded electronic modules and methods of manufacturing the same. FIG. 1 illustrates one embodiment of an electronic module 10 that has been manufactured in accordance with this disclosure. The electronic module 10 may be formed on a substrate 12. This substrate 12 may be made from any material(s) utilized to support electronic components. For example, the substrate 12 may be formed from laminates such as FR-1, FR-2, FR-3, FR-4, FR-5, FR-6, CEM-1, CEM-2, CEM-3, CEM-4, CEM-5, and the like. The substrate 12 may also be formed from ceramics and/or alumina.

The substrate 12 has a substrate body 13 and the substrate body 13 includes a component portion 14. In the illustrated embodiment, the component portion 14 is simply the portion of the substrate 12 that supports the structures of the electronic module 10. Thus, the component portion 14 may take up the entire substrate 12 or may take up only a particular portion of the substrate 12. The component portion 14 also includes a component area 16 on a surface 18 of the substrate 12 and one or more electronic components 20 formed on the component area 16. In this embodiment, a single electronic component 20 is attached to the component area 16 but other embodiments may have any number of electronic components 20 attached on the component area 16. Structures (not shown) that form part of or are coupled to the electronic component 20 may be formed within the component portion 14 of the substrate 12. In addition, the component portion 14 may include structures, such as conductive paths (not shown) that form internal and external connections to and from the electronic module 10.

The electronic component 20 may be any type of electronic component. For example, the electronic component 20 may be an electronic circuit having its own semiconductor substrate. The semiconductor substrate may be formed into various types of electronic components 20, such as one or more processors, volatile memory, non-volatile memory, a radio frequency circuit, or a micro-mechanical system (MEMS) device. The electronic component 20 may also be an electrical device such as filters, capacitors, inductors, and resistors or electronic circuits having any combination of these electronic devices.

To protect the electronic component 20 from both internal and external electromagnetic emissions, the electronic module 10 includes a first insulating layer 22, a second insulating layer 24, and an electromagnetic shield 26. In this embodiment, the first insulating layer 22, the second insulating layer 24, and the electromagnetic shield 26 are each formed over the component area 16 to cover the electronic component 20. The first insulating layer 22 and second insulating layer 24 are each formed from an insulating material that isolates the electronic component 20 from electromagnetic emissions. Exemplary insulating materials are silicon phosphide ($Si_xP_y$) type compounds like $Si_3P_4$, silicon nitride type compounds ($Si_xN_y$) like $Si_3N_4$, and/or silicon oxides ($SiO_x$) like silicon dioxide ($SiO_2$). In practice, the insulating materials do not completely isolate the electronic component 20. Some external electromagnetic emissions and internal electromagnetic emissions from the electronic component 20 may pierce through the first insulating layer 22 and second insulating layer 24. Nevertheless, the electromagnetic properties of the insulating material(s) substantially reduce these electromagnetic emissions in comparison to a medium such as earth's atmosphere.

In this embodiment, the electromagnetic shield 26 is attached to grounding elements 28. These grounding elements 28 may be positioned along a periphery 30 of the component portion 14. On the surface 18, the periphery 30 of the component portion 14 defines a periphery 32 of the component area 16 and thus the grounding element 28 is also positioned along the periphery 32 of the component area 16. The periphery 30 may be any boundary line, area, or volume that defines a boundary of the component portion 14. In addition, the periphery 32 may be any boundary line, area, or volume that defines the boundary of the component area 16. Thus, periphery 30 of the component portion 14 may include the periphery 32 of the component area 16 at or around the surface 18 of the substrate 12. Furthermore, the grounding element 28 may be positioned along the periphery 30 of the component portion 14 or the periphery 32 of the component area 16 by being within, adjacent to, close to the periphery 30 and/or the periphery 32. The grounding element 28 may also be positioned along the periphery 30 or the periphery 32 by defining the periphery 30 or the periphery 32.

The grounding elements 28 that attach to the electromagnetic shield 26 in FIG. 1 are metallic pillars in the component portion 14. However, the grounding elements 28 may be any type of electronic element that either provides or is configured to provide an internal or external connection to ground. In this embodiment, the grounding elements 28 extend through the substrate body 13 to form an external connection to ground. Accordingly, the grounding element 28 may be connected directly or indirectly to a grounding plate or a chassis. Conductive pads 34 are provided on the component area 16 and are positioned adjacent to the electronic component 20. These conductive pads 34 may be connected to other circuitry (not shown) formed on the component area 16 or within the component portion 14. The conductive pads 34 allow the electronic component 20 to form external or internal connections. For example, the conductive pads 34 may provide a connection to ground by being coupled to the grounding elements 28 and thus the conductive pads 34 may be grounding elements themselves. On the other hand, input/output signals may be transmitted to and from the electronic module 10 through the conductive pads 34. The conductive pads 34 may thus be coupled to conductive paths (not shown), that lead to terminals (not shown) or exposed on the exterior of the electronic module 10. Similarly, the conductive pads 34 may lead to ground terminals to provide the electronic component 20 with an independent connection to ground.

The electronic component 20 also includes conductive pads 36 and a conductive layer 38 formed over the first insulating layer 22. The conductive layer 38 electrically couples the conductive pads 34 on the component area 16 to the conductive pads 36 on the electronic component 20. In this manner, the electronic component 20 can make the desired connections to internal or external circuitry. The second insulating layer 24 is formed over the first insulating layer 22 and covers the conductive layer 38. The first insulating layer 22 thus isolates the conductive layer 38 from the substrate 12 and the electronic component 20 to reduce electromagnetic interference. In this embodiment, the conductive pads 36 are provided on a top surface 40 of the electronic component 20 and may each connect to different circuits or nodes within the electronic component 20. For example, one of the conductive pads 36 may be for transmitting output signals generated by the electronic component 20 while another one of the conductive pads 36 may be for receiving input signals. In the alternative, if the conductive pads 34 on the component area 16 form connections to ground, the conductive pads 36 may themselves be grounding elements.

Sections 42 of each of the conductive pads 34 on the component area 16 are uncovered by the first insulating layer 22. Similarly, sections 44 of each of the conductive pads 36 of the electronic component 20 are uncovered by the first insulating layer 22. In an alternative embodiment, the conductive pads 34 and the conductive pads 36 may be entirely uncovered by the first insulating layer 22 after the first insulating layer 22 is etched. The conductive layer 38 is attached to the sections 42 of the conductive pads 34 and the sections 44 of the conductive pads 36 to form an electrical connection. Also, the conductive layer 38 is shaped to extend between the conductive pads 34 and conductive pads 36 thereby electrically coupling the conductive pads 34 to the appropriate conductive pads 36. In this embodiment, the conductive layer 38 forms a trace 45A that extends between one of the conductive pads 36 of the electronic component 20 to one of the conductive pads 34 on the component area 16. A trace 45B is also formed by the conductive layer 38 that extends between another one of the conductive pads 36 of the electronic component 16 and another one of the conductive pads 34 on the component area 16. In this manner, traces 45A, 45B connect the appropriate conductive pad 34 to the appropriate conductive pad 36.

The conductive layer 38 is formed over the first insulating layer 22. In this case, the conductive layer 38 covers segments 46 of the first insulating layer 22 and the conductive layer 38 and conforms to the shape of these segments 46. The conductive layer 38 may also be made from any type of conductive material, such as copper (Cu), gold (Au), silver (Ag), nickel (Ni), or aluminum (Al). In addition, the conductive materials may also include metallic alloys and other metallic materials mixed with or forming ionic or covalent bonds with other non-metallic materials to provide a desired conductive property.

Accordingly, the conductive layer 38 shown in FIG. 1 minimizes the amount of space needed to electrically couple the conductive pads 34 to the conductive pads 36. In addition, the first insulating layer 22 may isolate the conductive layer 38 from the substrate 12 and segments of the top surface 40 of the electronic component 20 that are not attached to the conductive pads 36. This prevents shorts or electromagnetic radiation from interfering with the operation of the electronic component 20. The conductive layer 38 in this embodiment is formed as a redistribution layer (RDL) that provides a set of traces 45A, 45B on the surface 18 to route the connections between the conductive pads 36 on the electronic component 20 and the conductive pad 34 on the component area 16. The conductive layer 38 may be around 3 micrometers to 8 micrometers in thickness.

The second insulating layer 24 is formed over the component area 16 and should cover at least the conductive layer 38 so that the conductive layer 38 is isolated from the electromagnetic shield 26. In this case, the second insulating layer 24 is formed to cover the entire component area 16. The conductive layer 38 shown in FIG. 1, however, does not cover the entire component area 16 and in certain portions the second insulating layer 24 is stacked directly on the first insulating layer 22. At these portions, the first insulating layer 22 and second insulating layer 24 may be integrated with one another depending on the materials and manner of forming the first insulating layer 22 and the second insulating layer 24. For example, the first insulating layer 22 and the second insulating layer 24 of FIG. 1 may each be formed as a first dry film and a second dry film, made from the same insulating material, such as $SiO_2$, $Si_3P_4$, or $Si_3N_4$. Consequently, at the locations where the first insulating layer 22 and second insulating layer 24 meet the second insulating layer 24, the first insulating layer 22 and second insulating layer 24 may appear as an integrated layer. In the alternative, the first dry film and the second dry film may be made from different insulating materials or the insulating materials may have different physical properties. For example, the first dry film may be made from $Si_3P_4$ while the second dry film may be made from $SiO_2$ and thus may be distinct from one another at the locations where the second insulating layer 24 is directly on the first insulating layer 22.

The electromagnetic shield 26 is formed over the first insulating layer 22 and the second insulating layer 24. In this embodiment, the electromagnetic shield 26 covers the entire component area 16 and is formed directly on the second insulating layer 24. The electromagnetic shield 26 thus conforms to the shape of the second insulating layer 24. The electromagnetic shield 26 also extends onto and is attached to a top portion 48 of the grounding elements 28. The top portion 48 of each of the grounding elements 28 are uncovered by the first insulating layer 22 and the second insulating layer 24 and the electromagnetic shield 26 attaches to the top portion 48 to connect to ground. The second insulating layer 24 thus isolates the electromagnetic shield 26 from the electromagnetic emissions generated by the conductive layer 38. The first and second insulating layers 22, 24 isolate the electronic component 20, the conductive layer 38, and the substrate 12 from one another.

Generally, electronic component 20 may have a height from a few micrometers to hundreds of micrometers. The distance of the electromagnetic shield 26 from the top surface 40 of the electronic component 20 is around 50 micrometers to 100 micrometers. Thus, the total height of the electronic module 10 from the component area 16 may be just over 50 micrometers to hundreds of micrometers. For example, the electronic component 20 may be a silicon (Si) based or gallium arsenide (GaAs) based semiconductor die, which could have a height of around 100 micrometers. Thus, the height from the component area 16 to the highest location of the electromagnetic shield 26 may be around 150 to 200 micrometers. The height may vary in accordance with the dimensions of the particular electronic component 20 provided in the electronic module 10 as well as the desired thickness and/or configuration of the first insulating layer 22, the second insulating layer 24, the electromagnetic shield 26, and the conductive layer 38. In addition, note that additional layers may be provided between, above, or beneath the first insulating layer 22, second insulating layer 24, electromagnetic shield 26 and the conductive layer 38 to provide the electronic module 10 with desired electrical properties and this may also affect the height of the electronic module 10.

Figure 2:
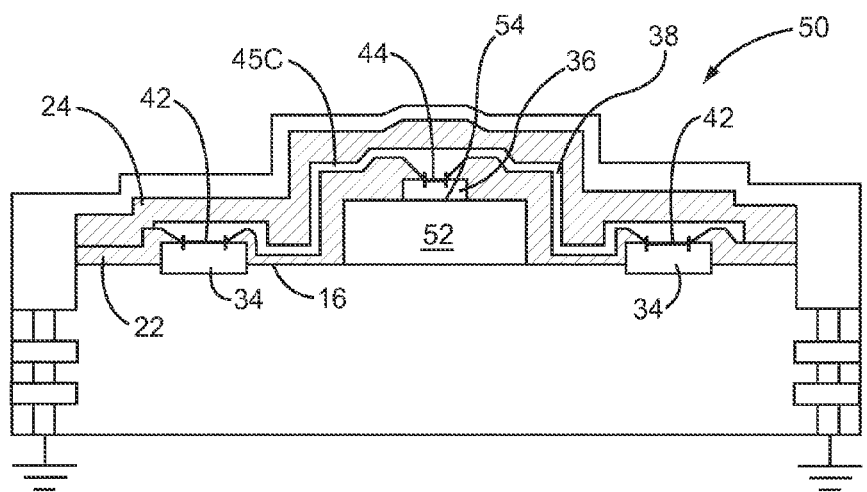
FIG. 2 illustrates a second embodiment of an electronic module in accordance with this disclosure.

FIG. 2 illustrates a second embodiment of an electronic module 50. The electronic module 50 is similar to the electronic module 10 shown in FIG. 1. However, in this embodiment, the electronic module 50 has an electronic component 52 attached to the component area 16. FIG. 2 shows only a single conductive pad 36 on a top surface 54 of the electronic component 52. The conductive layer 38 electrically couples the conductive pad 36 to both of the conductive pads 34 on the component area 16. As discussed in the previous embodiment, the conductive layer 38 may be attached to the sections 42 and the sections 44 of the conductive pads 34, 36, which are uncovered by the first insulating layer 22. In this embodiment, the conductive layer 38 is formed over the first insulating layer 22 and is formed as a single trace 45C that extends from the conductive pad 36 on the electronic component 52 to both of the conductive pads 34 on the component area 16. In this manner, both conductive pads 34 on the component area 16 are electrically coupled to the conductive pad 36 on the electronic component 52.

Figure 3:
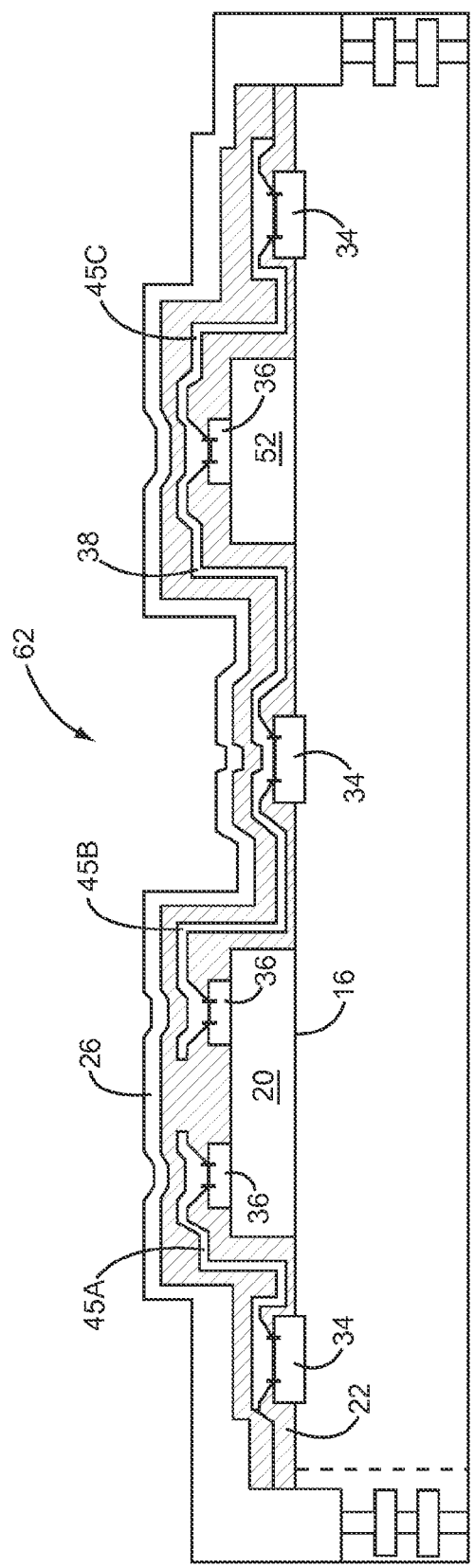
FIG. 3 illustrates a third embodiment of an electronic module in accordance with this disclosure.

FIG. 3 illustrates a third embodiment of an electronic module 62. In this embodiment, the electronic module 62 has both the electronic component 20 discussed for FIG. 1 and the electronic component 52 discussed for FIG. 2 on the component area 16. Accordingly, the electromagnetic shield 26 covers the component area 16 to shield both the electronic component 20 and the electronic component 52. Any number of electronic components 20, 52 may be attached to the component area 16. In this embodiment of the electronic module 62, the conductive layer 38 is formed over the first insulating layer 22 so that the conductive pad 36 on the electronic component 52 and one of the conductive pads 36 on the electronic component 20 are electrically coupled by the conductive layer 38 to the conductive pad 34 on the component area 16 between the electronic component 20 and the electronic component 52. Thus, the conductive layer 38 forms the trace 45B that extends from one of the conductive pads 36 on the electronic component 20 to the conductive pad 34 between the electronic component 20 and the electronic component 52. The trace 45C formed by the conductive layer 38 extends from the conductive pad 34 between the electronic component 20 and the electronic component 52 to the conductive pad 36 of the electronic component 52. Trace 45C also extends from the conductive pad 36 on the electronic component 52 to the other conductive pad 34 adjacent to the electronic component 52. Trace 45B and trace 45C are thus integrated to form a single trace. Trace 45B and trace 45C also electrically couple the electronic component 20 to the electronic component 52. Thus, the conductive layer 38 may be utilized to send input/output signals between the electronic component 20 and the electronic component 52. In the alternative, the conductive pad 34 on the component area 16 adjacent to the electronic component 52 may be externally connected to a common reference voltage, such as ground, or a supply voltage. The conductive pad 36 on the electronic component 52 and the conductive pad 36 on the electronic component 20 may be electrically coupled by trace 45B and trace 45C to receive the common reference voltage or the supply voltage. The other conductive pad 36 on the electronic component 20 is not connected to the electronic component 52 and trace 45A independently connects this conductive pad 36 to another conductive pad 34 that is adjacent to the electronic component 20. This trace 45A may be used by circuitry external to the electronic module 62 to send or receive input/output signals.

FIGS. 4A-4L illustrate steps for manufacturing the electronic module 10 in FIG. 1. Note, however, that similar steps may be utilized to manufacture the electronic module 50 and the electronic module 62 discussed above in FIGS. 2 and 3. Also note that FIGS. 4A-4L describe one embodiment for manufacturing the electronic module 10 and additional steps, different steps, and/or steps in a different order than the steps described herein may be utilized to manufacture the electronic module 10 as well as other embodiments of the electronic module.

Figure 4A:
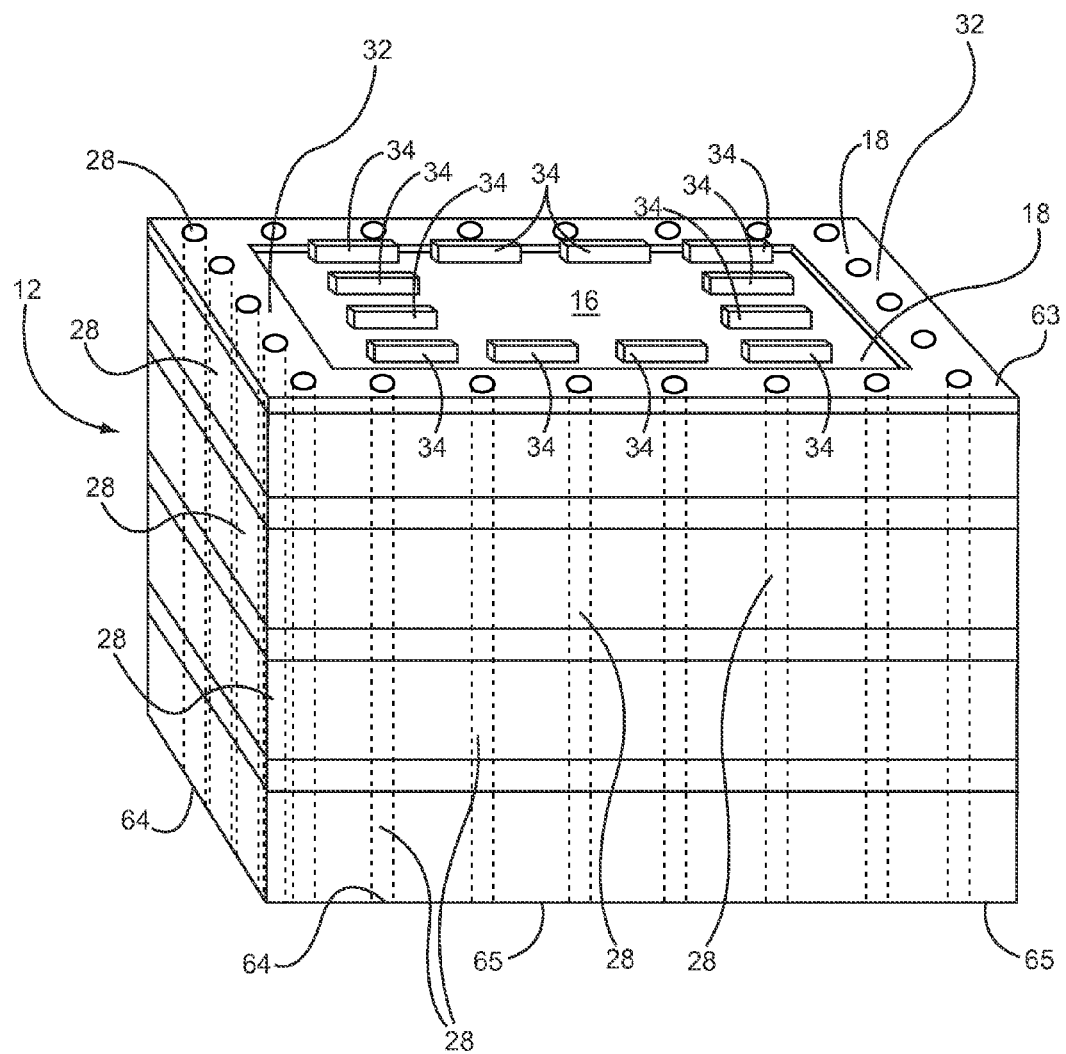

To manufacture the electronic module 10 (shown in FIG. 1), the substrate 12 is provided having the substrate body 13 that defines the component portion 14 (FIG. 4A). The component portion 14 of the substrate 12 has the component area 16 on the surface 18 of the substrate 12. A metallic structure 63 is positioned along the periphery 30 of the component portion 14 and has various grounding elements 28. As explained in further detail below, the grounding elements 28 of the metallic structure 63 may be metallic layers and metallic pillars. Thus, the grounding elements 28 are positioned along the periphery 30 of the component portion 14 and the periphery 32 of the component area 16. A bottom end 64 of the grounding elements 28 are exposed through the substrate 12. The bottom ends 64 of the grounding elements 28 thus allow for direct or indirect connections to ground. The conductive pads 34 are attached on the component area 16 and, in this embodiment, are square pads. However, the conductive pads 34 may be formed in any desired shape such as, for example, a round shape. If required, a bottom surface 65 of the substrate may be taped (not shown) to protect the bottom surface 65 from contaminants.

Figure 4B:
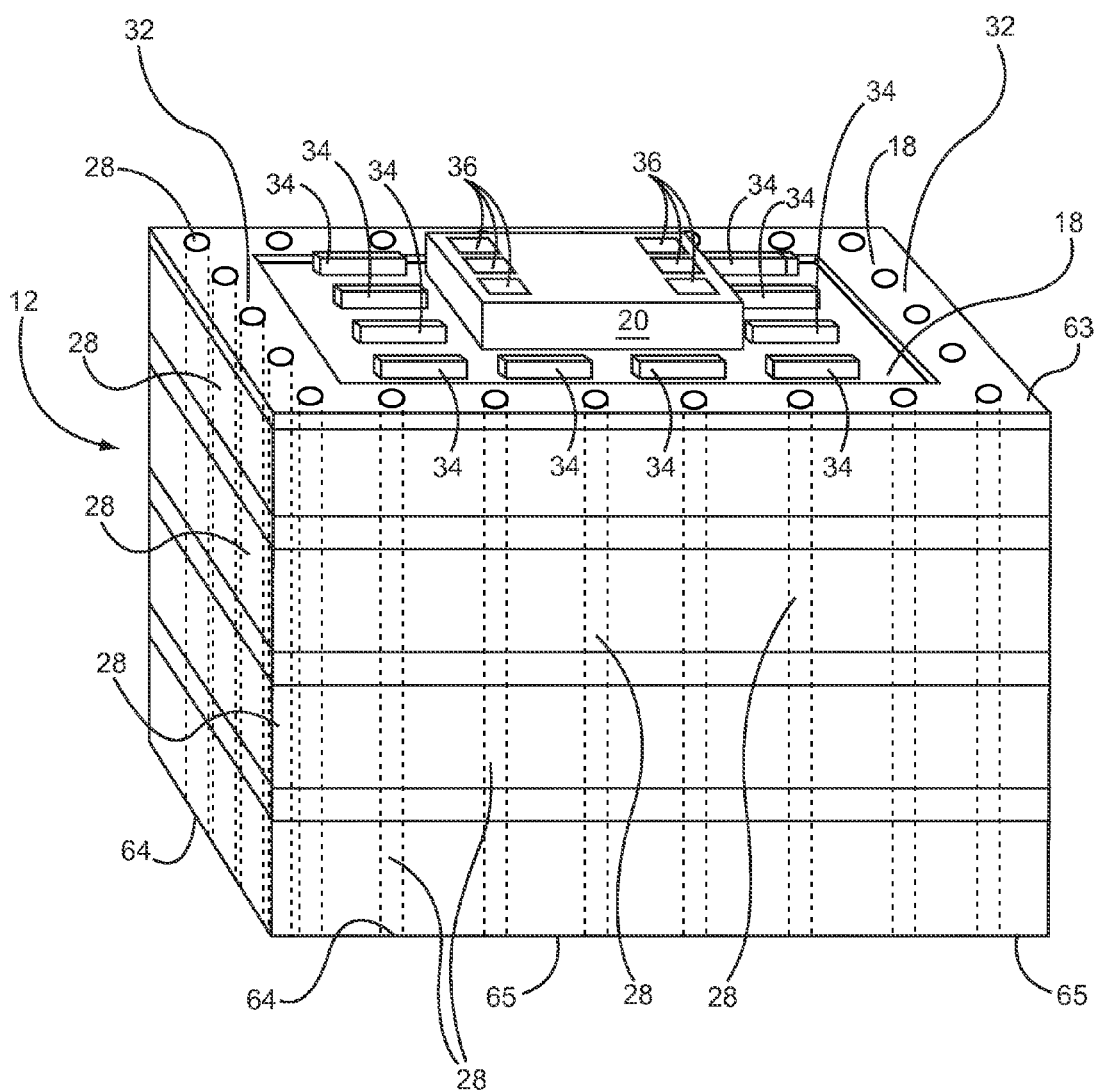

Next, the electronic component 20 is attached on the component area 16 (FIG. 4B). The conductive pads 34 on the component area 16 are provided so that the conductive pads 34 are adjacent to and are formed around the periphery of the electronic component 20. The electronic component 20 may be attached on the component area 16 using an attachment material, such as an epoxy, solder, or the like. This attachment material may be cured and the substrate 12 may then be cleaned to remove contaminants. In this embodiment, the substrate 12 is cleaned using a plasma cleaning process. In the plasma cleaning process, plasma may be created in a chamber from a plasma source. The plasma is then propelled in pulses onto the component area to remove contaminants from the substrate 12. The plasma source may be a gas at low or atmospheric pressure. High frequency voltages may be applied to the plasma source to ionize the gas and thereby create the plasma. The plasma and electromagnetic radiation created by the plasma interact with contaminants to remove them from the substrate 12. For the plasma cleaning process, the gas may be argon (Ar), oxygen (O), hydrogen (H), and/or nitrogen (N) and the like, which are effective at removing contaminants with a high molecular weight when excited into the plasma. Accordingly, the plasma cleaning process is a dry cleaning technique that provides an effective and economical way of removing contaminants. However, other types of cleaning techniques, such as wet cleaning techniques, may be utilized depending on the composition of the materials utilized to form the first insulating layer 22 and the substrate 12.

Figure 4C:
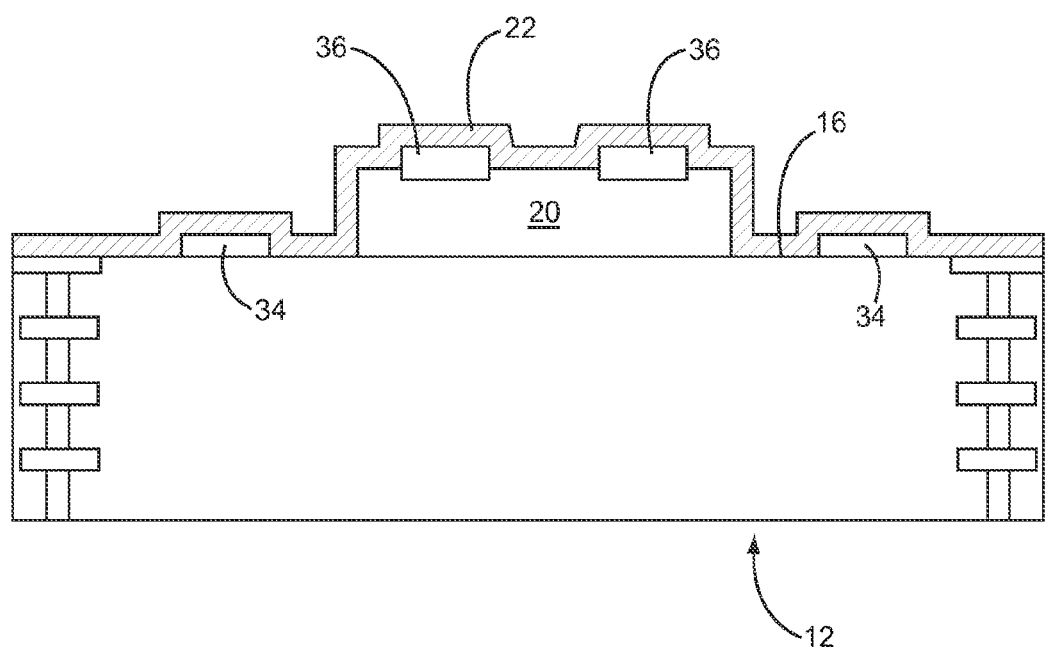

Next, the first insulating layer 22 is provided by coating the first dry film over the component area 16 (FIG. 4C). The first insulating layer 22 should at least cover the electronic component 20 and the conductive pads 34 on the component area 16. In this manner, the electronic component 20 may be isolated from the electromagnetic shield 26 (shown in FIG. 1). Also, the traces 45A, 45B (shown in FIG. 1) formed by the conductive layer 38 (shown in FIG. 1) may be isolated from the substrate 12 and the electromagnetic radiation generated from the conductive layer 38 reduces or eliminates electromagnetic interference between the electronic component 20 and the conductive layer 38. In this example, the first insulating layer 22 is coated to cover the entire component area 16 and also is coated on the top portion 48 of the grounding elements 28.

Figure 4D:
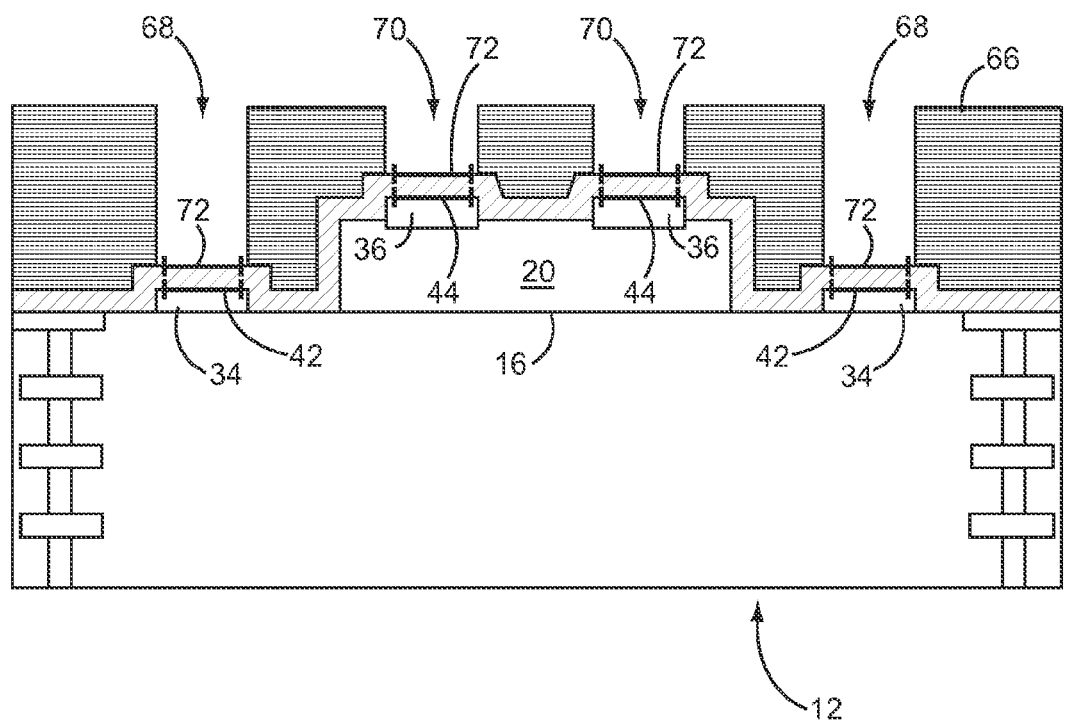

Plasma etching may then be utilized to shape the first insulating layer 22. To do this, a mask 66 is placed over the first insulating layer 22 (FIG. 4D). The mask 66 is aligned so that openings 68 are directly over the sections 42 of each of the conductive pads 34 on the component area 16. In addition, the mask 66 has openings 70 that are aligned directly over the sections 44 of the conductive pads 36 of the electronic component 20. The openings 68 and openings 70 in the mask 66 illustrated in FIG. 4D are dimensioned so that segments 72 of the first insulating layer 22 are plasma etched. The mask 66 in FIG. 4D allows for the sections 42 of the conductive pads 34 and sections 44 to be exposed by the plasma etch. In alternative embodiments, the openings 68 and/or openings 70 of the mask may be dimensioned so that the conductive pads 34 and/or conductive pads 36 are completely exposed by the plasma etch.

Figure 4E:
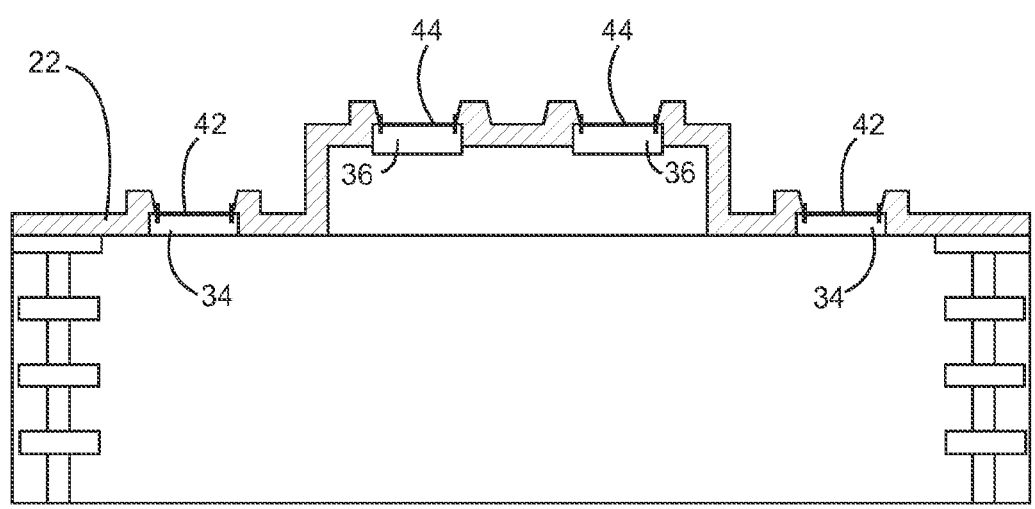

Plasma is then created from a plasma source to perform the plasma etch. The plasma source may be a gas such as carbon tetraflouride (CF4), hexaflourosilicate anion (SiF6), nitrogen triflouride (NF3), and the like. The plasma is then applied to the first insulating layer 22 which etches the segments 72 of the first insulating layer 22. The mask 66 can then be removed and the sections 42 of the conductive pads 34 and the sections 44 of the conductive pads 36. The plasma etch exposes the sections 42 of the conductive pads 34 and the sections 44 of the conductive pads 36 through the first insulating layer 22 (FIG. 4E). In the alternative, other etching techniques, such as wet etching techniques, may be utilized in accordance with the materials utilized to form the first insulating layer 22.

Figure 4F:
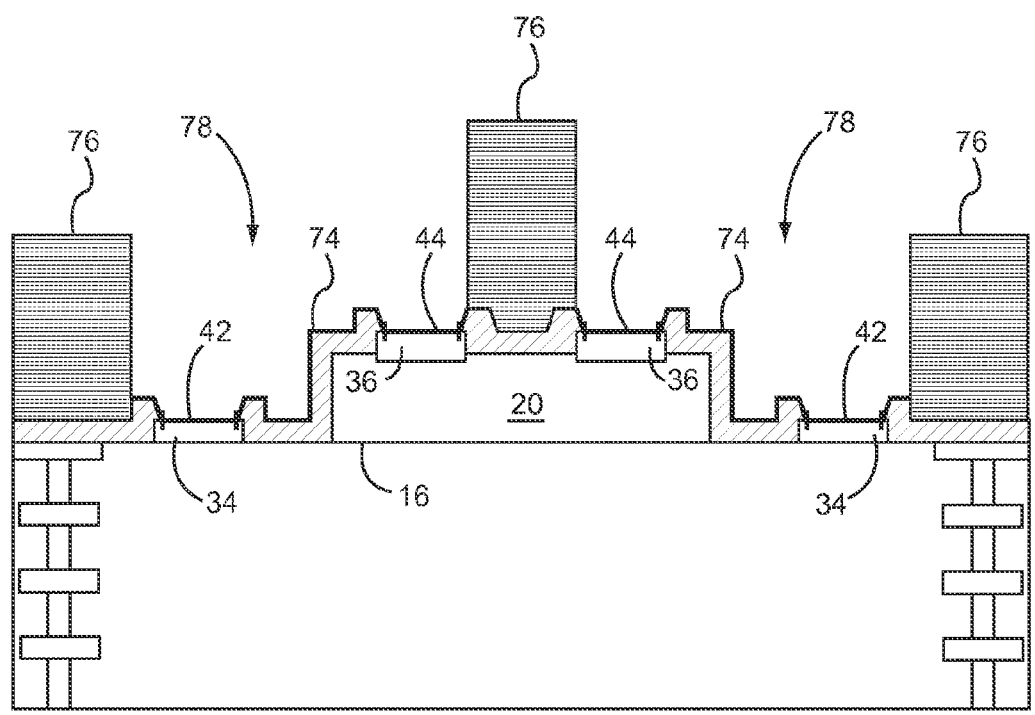
Figure 4G:
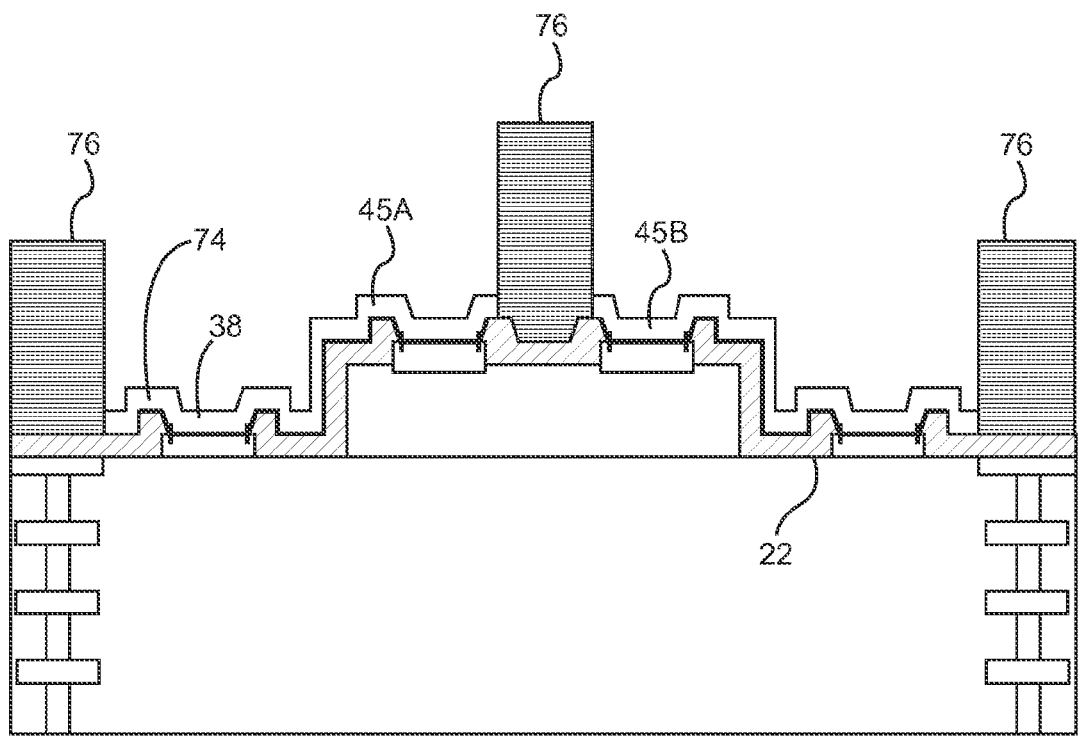

Once the sections 42 of the conductive pads 34 and the sections 44 of the conductive pads 36 have been exposed, a conductive seed layer 74 may be provided over the component area 16 (FIG. 4F). Then, a mask 76 is provided over the first insulating layer 22 and has openings 78. The conductive seed layer 74 covers the sections of the first insulating layer 22 for the traces 45A, 45B (See FIG. 1). Furthermore, the conductive seed layer 74 also attaches to the sections 42 of each of the conductive pads 34, and the sections 44 of the conductive pads 36, which have been exposed through the conductive seed layer 74. Next, an electroplating process is performed, which applies a conductive material to the conductive seed layer 74 to provide the conductive layer 38 (FIG. 4G). In this manner, traces 45A, 45B are formed by the conductive layer 38.

Figure 4H:
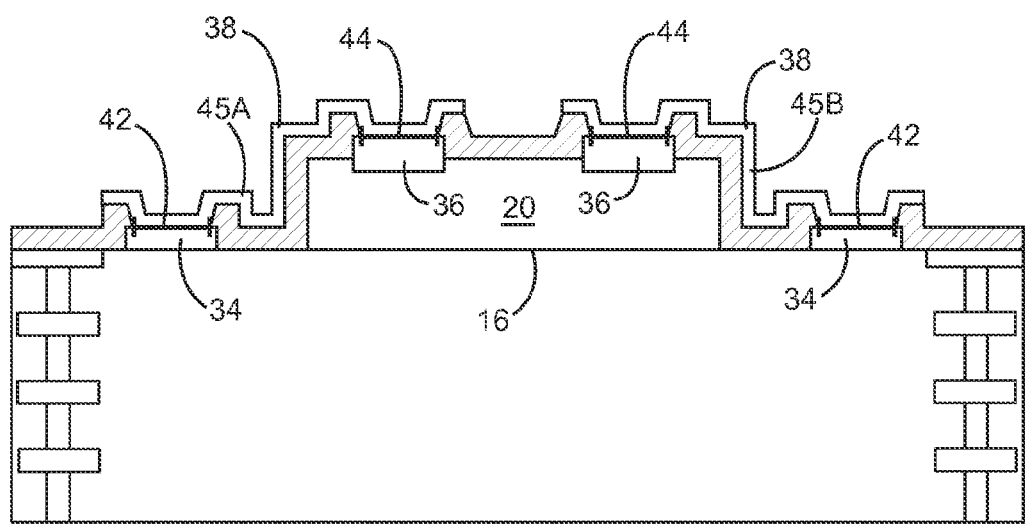
Figure 41:
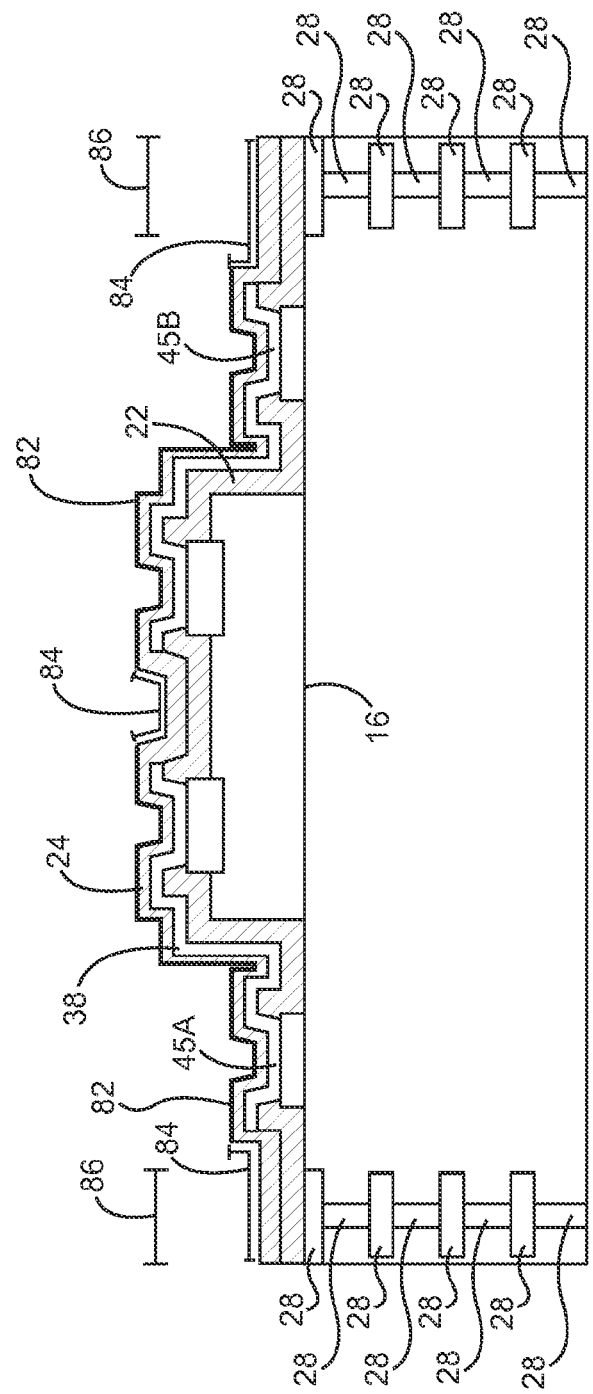

The mask 76 may then be removed (FIG. 4H). In this embodiment, the trace 45A is connected to one of the sections 44 of one of the conductive pads 36 and one of the sections 42 of one of the conductive pads 34. Trace 45A also extends between one of the conductive pads 36 on the electronic component 20 and one of the conductive pads 36 on the component area 16. the trace 45B is connected to one of the sections 44 of another one of the conductive pads 36 and one of the sections 42 of another one of the conductive pads 34. The trace 45B also extends between another one of the conductive pads 36 on the electronic component 20 and another one of the conductive pads 34 on the component area 16. Thus, FIG. 4H illustrates connections for two of the conductive pads 36 of the electronic component 20 to two of the conductive pads 34 on the component area 16 shown in FIGS. 4A and 4B. However, some or all of the other conductive pads 36 of the electronic component 20 and conductive pads 34, shown by FIGS. 4A and 4B may be electrically connected by other traces formed by the conductive layer 38, and/or by the traces 45A, 45B. The conductive seed layer 74 (shown in FIG. 4G) is no longer explicitly shown underneath the conductive layer 38. This is done for the purposes of clarity and the portion of the conductive seed layer 74 underneath the traces 45A, 45B remains. The conductive seed layer 74 may actually have been integrated into the conductive layer 38 by the electroplating process.

Figure 4J:
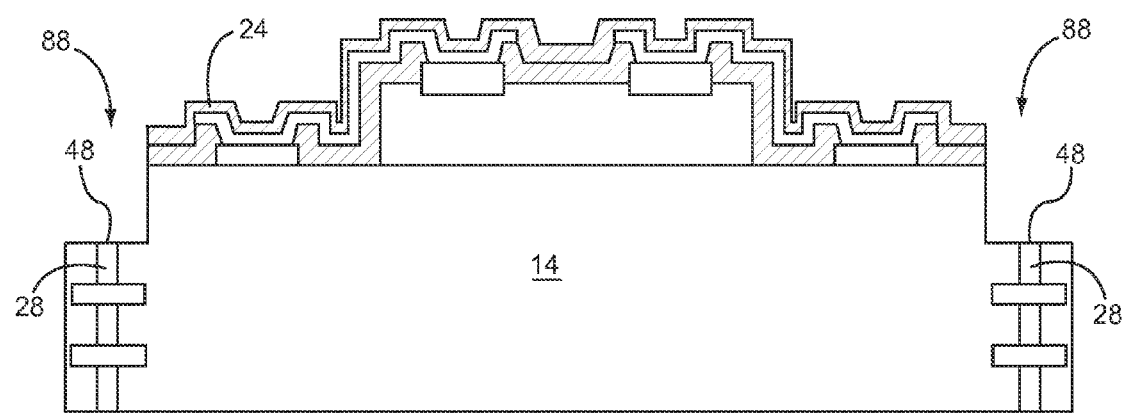

Next, the second insulating layer 24 is provided over the first insulating layer 22 (FIG. 4I). The second insulating layer 24 should be provided to at least cover the conductive layer 38. The second insulating layer 24 thus electromagnetically isolates the traces 45A, 45B to reduce or eliminate electromagnetic interference. In this embodiment, the second insulating layer 24 is provided to cover the entire component area 16. Segments 82 of the second insulating layer 24 are attached on the traces 45A, 45B of the conductive layer 38, segments 84 of the second insulating layer 24 are attached on the first insulating layer 22, and segments 86 of the segments 84 are attached over the grounding elements 28. Next, an opening 88 is cut through the second insulating layer 24, the first insulating layer 22, and into the substrate body 13 of the substrate 14 (FIG. 4J). In this manner, the portion 48 of the grounding elements 28, in this case metallic pillars, are no longer covered by the second insulating layer 24 and are exposed through the substrate 14.

Figure 4K:
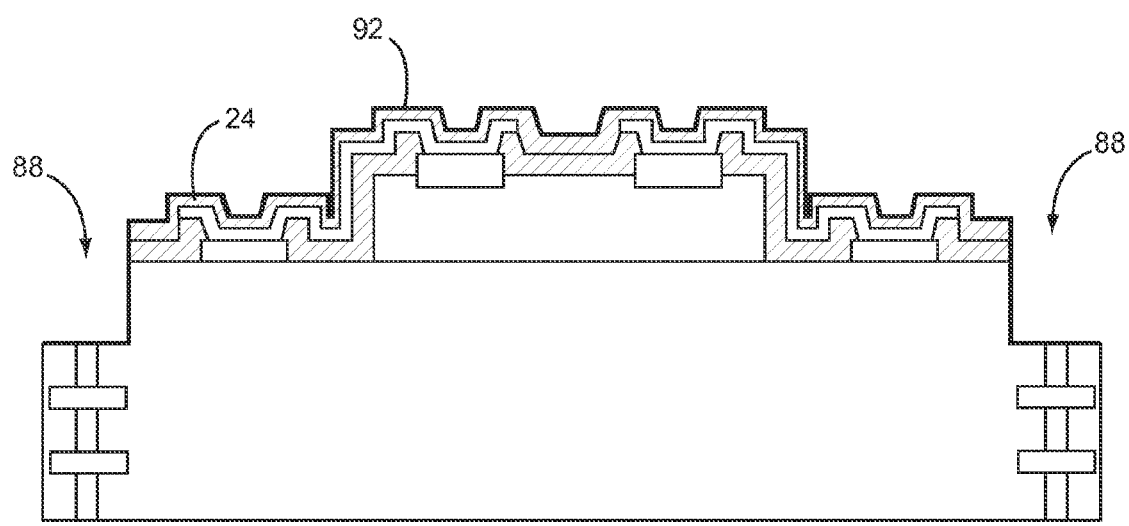
Figure 4L:
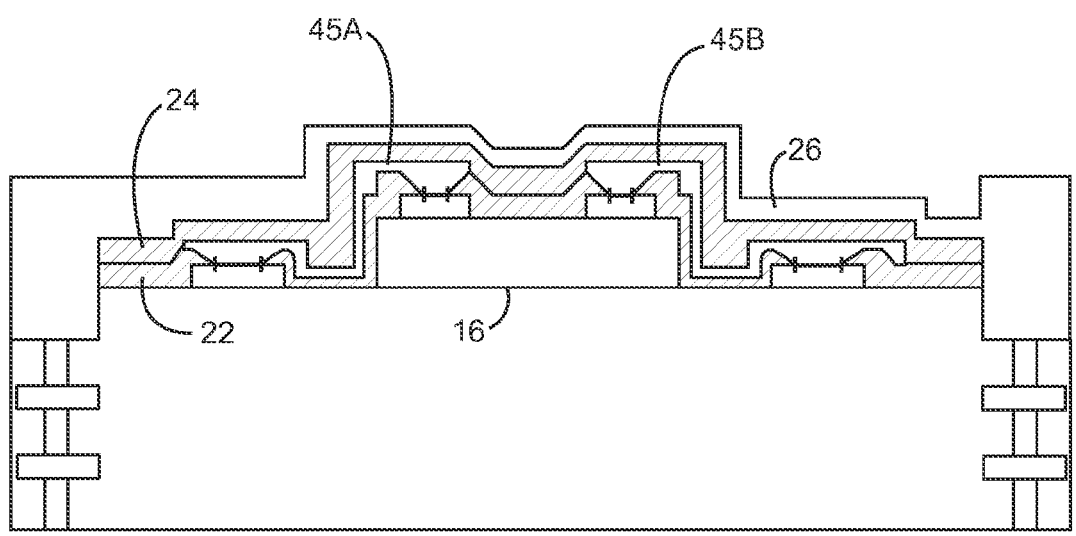

Another conductive seed layer 92 may then be coated over the second insulating layer 24 and the first insulating layer 22 (FIG. 4K). In this embodiment, the conductive seed layer 92 covers the component area 16. In addition, the conductive seed layer 92 is attached to the portion 48 of the grounding elements 28 exposed through the opening 88. Next, an electromagnetic shielding material is applied to the conductive seed layer 92 through an electroplating process or the like to form the electromagnetic shield 26 that covers the component area 16 (FIG. 4L). The electromagnetic shield 26 is also formed to attach to the portion 48 of the grounding elements 28 so that the electromagnetic shield 26 can be coupled to ground. Note that FIG. 4L no longer explicitly shows the conductive seed layer 92 (shown in FIG. 4K) underneath the electromagnetic shield 26. The conductive seed layer 92 is not explicitly shown in FIG. 4L for the purposes of clarity. However, the conductive seed layer 92 remains underneath the electromagnetic shield 26 and may actually have been integrated into the electromagnetic shield 26 by the electroplating process. In alternative embodiments, the electromagnetic shield 26 may be directly attached to other grounding elements 28 of the metallic structure 63. For example, the second insulating layer 24 may be formed to only cover the traces 45A, 45B.

Figure 5:
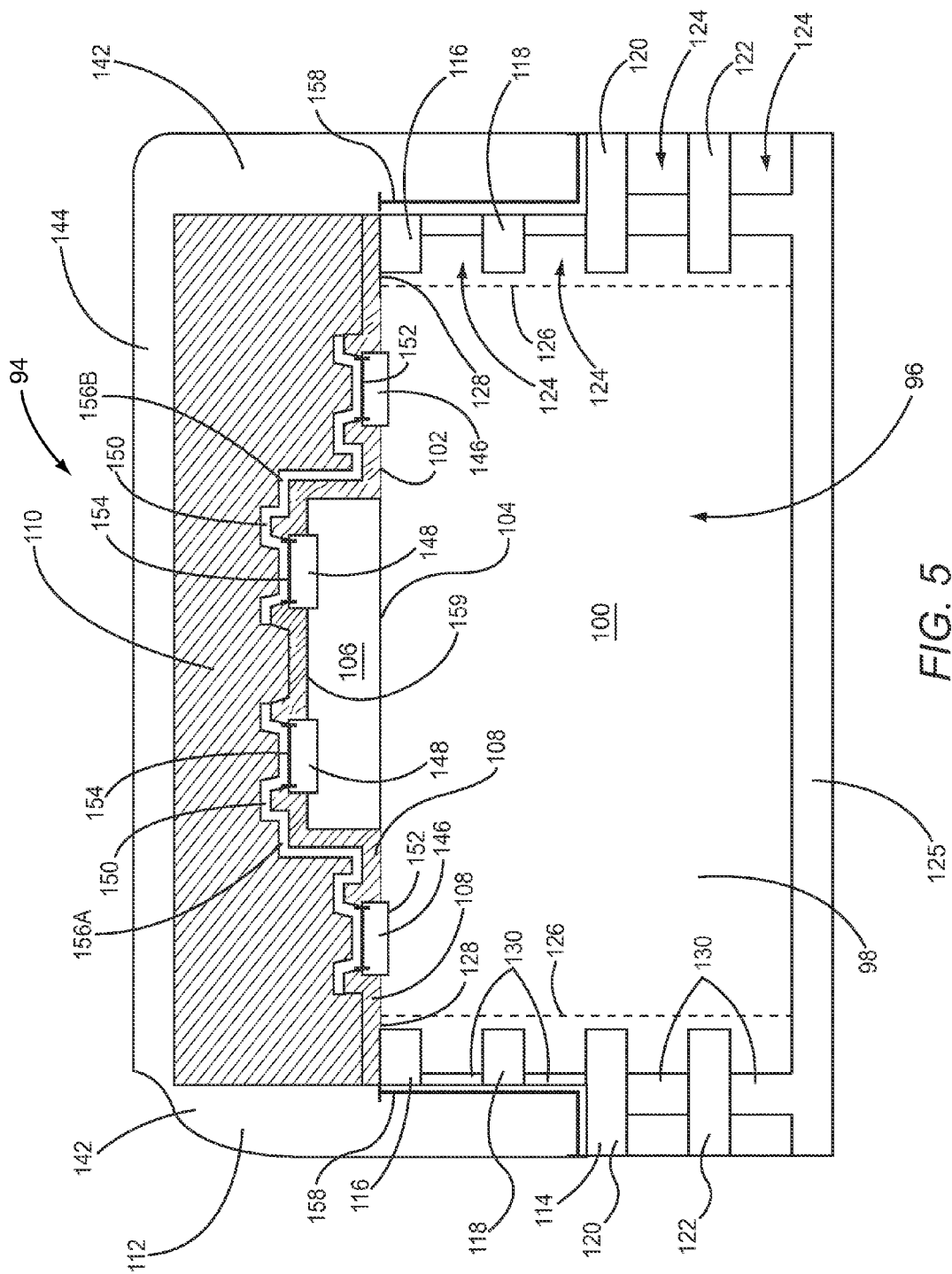
FIG. 5 illustrate a fourth embodiment of an electronic module in accordance with this disclosure.

FIG. 5 illustrates another embodiment of an electronic module 94 manufactured in accordance with this disclosure. The electronic module 94 is formed on a substrate 96, which may be made from any material(s) utilized to support electronic components. The substrate 96 has a substrate body 98 that includes a component portion 100 for the electronic module 94. In the illustrated embodiment, the component portion 100 is simply the portion of the substrate 96 that supports the structures of the electronic module 94. Thus, the component portion 100 may take up the entire substrate 96 or may take up only a particular portion of the substrate 96. The component portion 100 includes a component area 102 on a surface 104 of the substrate 96 and one or more electronic components 106 formed on the component area 102. Also, structures (not shown) that form part of or are coupled to the electronic component 106 may be formed within the component portion 100. In addition, the component portion 100 may include conductive paths (not shown) that are utilized to form internal and external connections to and from the electronic module 94.

The electronic components 106 may be any type of electronic component. For example, electronic components 106 may be an electronic circuit built on its own semiconductor substrate, such as a processor, volatile memory, non-volatile memory, a radio frequency circuit, or a micro-mechanical system (MEMS) device. Electronic components 106 may also be electrical devices such as filters, capacitors, inductors, and resistors or electronic circuits having any combination of these electronic devices.

To protect the electronic components 106 from both internal and external electromagnetic emissions, the electronic module 94 includes a first insulating layer 108, a second insulating layer 110, and an electromagnetic shield 112, which may each be formed over the component area 102 to cover the electronic components 106. The first insulating layer 108 and second insulating layer 110 may be utilized to isolate the electronic component 106 and may be made from insulating materials, such as, silicon phosphide (SixPy) type compounds like Si3P4, or silicon nitride type compounds (SixNy) like Si3N4, and/or silicon oxides (SiOx) like silicon dioxide ($SiO_2$). As explained in further detail below, the first insulating layer 108 is made from a dry film that has been plasma etched. On the other hand, the second insulating layer 110 is an overmold.

In this embodiment, the electromagnetic shield 112 is attached to a metallic structure 114. This metallic structure 114 includes a first metallic layer 116, a second metallic layer 118, a third metallic layer 120, and a fourth metallic layer 122. The substrate 96 may be formed from vertically stacked insulation layers 124 that make up the substrate body 98 of the component portion 100. These vertically stacked insulation layers 124 may be made from any type of insulating material utilized to support an electronic component 106 such as FR-1, FR-2, FR-3, FR-4, FR-5, FR-6, CEM-1, CEM-2, CEM-3, CEM-4, CEM-5, and the like.

In this embodiment, the fourth metallic layer 122 may be attached to a grounding plate 125 and thus the metallic structure 114 is configured to ground the electromagnetic shield 112. The first metallic layer 116 is attached on the surface 104, and the second metallic layer 118, the third metallic layer 120, and the fourth metallic layer 122 are placed between the vertically stacked insulation layers 124 of the component portion 100. The first metallic layer 116, the second metallic layer 118, the third metallic layer 120, and the fourth metallic layer 122 may extend about a periphery 126 of the component portion 100 to circumscribe a cross-sectional area of the component portion 100. For example, the first metallic layer 116 on the surface 104 of the component portion 100 surrounds a periphery 128 of the component area 102 on the surface 104. The periphery 126 of the component portion 100 may be any boundary line, area, or volume that defines a boundary of the component portion 100. Similarly, the periphery 128 may be any boundary line, area, or volume that defines a boundary of the component area 102. In this embodiment, the periphery 128 of the component area 102 is included as part of the periphery 126 of the component portion 100. Substrate 96 may also include additional layers above, below, and between the first metallic layer 116, the second metallic layer 118, the third metallic layer 120, the fourth metallic layer 122, and the vertically stacked insulation layers 124 depending on the particular design and desired electrical characteristics for the electronic module 94. Furthermore, the first metallic layer 116, the second metallic layer 118, the third metallic layer 120, and the fourth metallic layer 122 may extend along or about the periphery 126 or the periphery 128 by being within, adjacent to, close to, or by defining the periphery 126 or the periphery 128, respectively.

The first metallic layer 116, the second metallic layer 118, the third metallic layer 120, and the fourth metallic layer 122 are coupled to one another utilizing conductive vertical interconnect access structures ("vias") 130. The conductive vias 130 may be any type of structure that connects electronic elements on different vertical levels of a substrate 96. For example, conductive vias 130 may be formed as plated through-holes, conductive pillars, conductive bars, and the like. In this embodiment, the conductive vias 130 substantially surround the periphery 126 and circumvent the parts of the component portion 100 between the first metallic layer 116, the second metallic layer 118, the third metallic layer 120, and the fourth metallic layer 122. These conductive vias 130 also are attached between the grounding plate 125 and the fourth metallic layer 122 to connect the metallic structure 114 to ground.

Since metallic structure 114 in FIG. 5 is configured to provide a conductive path to ground, the metallic structure 114 is a grounding element. Furthermore, the individual elements of the metallic structure 114, such as the first metallic layer 116, the second metallic layer 118, the third metallic layer 120, the fourth metallic layer 122, and the conductive vias 130 are also grounding elements. The first metallic layer 116, the second metallic layer 118, the third metallic layer 120, the fourth metallic layer 122, and the conductive vias 130 may be made from any type of metal such as, for example, copper (Cu), gold (Au), silver (Ag), or nickel (Ni). The metallic material may also include metallic alloys and other metallic materials mixed with or forming ionic or covalent bonds with other non-metallic materials to provide a desired material property.

The electromagnetic shield 112 shown in FIG. 5 is attached to the first metallic layer 116 of the metallic structure 114 along the periphery 128 of the component area 102. The other metallic layers 118, 120, and 122 are within the substrate 96 and below the first metallic layer 116. However, in alternative embodiments, the electromagnetic shield 112 may attach to any of the metallic layers 116, 118, 120, and 122 or the conductive vias 130, if cuts are made into the component portion 100. Since the first metallic layer 116, the second metallic layer 118, the third metallic layer 120, and the fourth metallic layer 122 extend along and/or are positioned at the periphery 126 of the component portion 100, the metallic layers 116, 118, 120, and 122 make it easier to attach the electromagnetic shield 112 to ground. The electromagnetic shield 112 may include lateral portions 142 and a top portion 144. The lateral portions 142 extend downward and attach to the first metallic layer 116, second metallic layer 118, the vias 130 associated with the first and second metallic layer 116, 118, and the third metallic layer 120 to ground the electromagnetic shield 112.

Conductive pads 146 are provided on the component area 102 and are positioned adjacent to the electronic component 106. These conductive pads 146 may be connected to other circuitry (not shown) formed on the component area 102 or within the component portion 100 to allow the electronic component 106 to form connections internally within the electronic module 94 or to other external electronic circuitry (not shown). For example, the conductive pads 146 may provide a connection to ground by being connected to the metallic structure 114 and thus the conductive pads 146 may be grounding elements themselves. On the other hand, input/output signals may be transmitted externally to and from the electronic module 94 if the conductive pads 146 are connected to input/output terminals (not shown) in the electronic module 94 for connecting to external electronic circuitry.

The electronic component 106 also includes conductive pads 148 that are coupled to the conductive pads 146 on the component area 102 by a conductive layer 150. The conductive layer 150 is formed over the first insulating layer 108 and the second insulating layer 110 is formed over the conductive layer 150. The conductive layer 150 may be formed to provide traces 156A, 156B that electrically couple the appropriate conductive pad 148 in the electronic component 106 to the appropriate conductive pad 146 on the component area 102. The conductive pads 148 may each connect to different circuits or nodes within the electronic component 106.

Sections 152 of each of the conductive pads 146 on the component area 102 are uncovered by the first insulating layer 108. Similarly, sections 154 of each of the conductive pads 148 of the electronic component 106 are uncovered by the first insulating layer 108. In an alternative embodiment, the conductive pads 146 and the conductive pads 148 are entirely uncovered by the first insulating layer 108 after the first insulating layer 108 is etched, as explained in further detail below. The conductive layer 150 is attached to the sections 152 of the conductive pads 146 and the sections 154 of the conductive pads 148. Also, the conductive layer 150 is shaped to extend between the conductive pads 146 and the conductive pads 148 to electrically couple the appropriate conductive pads 146 to the appropriate conductive pads 148. In this case, the conductive layer 150 forms the trace 156A that extends between one of the conductive pads 148 to one of the conductive pads 146 and the trace 156B that extends between another one of the conductive pads 148 and another one of the conductive pads 146.

The conductive layer 150 has been formed over the first insulating layer 108. In this case, the conductive layer 150 covers segments of the first insulating layer 108 and the conductive layer 150 conforms to the shape of these segments. The conductive layer 150 may also be made from any type of conductive material, such as copper (Cu), gold (Au), silver (Ag), nickel (Ni), or aluminum (Al). In addition, the conductive materials may also include metallic alloys and other metallic materials mixed with or forming ionic or covalent bonds with other non-metallic materials to provide a desired conductive property.

Accordingly, the conductive layer 150 shown in FIG. 1 minimizes the amount of space needed to electrically couple the conductive pads 146 to the conductive pads 148. In addition, the first insulating layer 108 may isolate the conductive layer 150 from the substrate 96 and segments of the electronic component 106 that are not attached to the conductive pads 148 thereby reducing electromagnetic interference. The conductive layer 150 may thus be formed as a redistribution layer (RDL) that provides a set of traces 156A, 156B on the surface 104 to route the connections between the conductive pads 148 on the electronic component 106 and the conductive pad 146 on the component area 102. The conductive layer 150 may be around 3 micrometers to 8 micrometers in thickness.

The second insulating layer 110 is formed over the component area 102 and should cover at least the conductive layer 150 so that the conductive layer 150 is isolated from the electromagnetic shield 112. In this case, the second insulating layer 110 covers the component area 102 and is formed on the conductive layer 150 and to segments of the first insulating layer 108. In addition, the second insulating layer 110 is formed as an overmold, which may have a thickness from a top surface 159 of the electronic component 106 to the electromagnetic shield 112 of around 50 micrometers to 300 micrometers. However, since the conductive layer 150 shown in FIG. 1 does not cover the entire component area 102, on certain segments, the second insulating layer 110 is stacked directly on the first insulating layer 108. At segments, the first insulating layer 108 and the second insulating layer 110 may be integrated with one another depending on the materials and manner of forming the first insulating layer 108 and the second insulating layer 110. For example, the first insulating layer 108 may be a dry film and the second insulating layer 110 may be an overmold made from the same insulating material, such as $SiO_2$ and the like. In the alternative, the dry film may be made from different insulating materials or the insulating material of the second insulating layer 110 may have different physical properties than those of the first insulating layer 108.

The electromagnetic shield 112 is formed over the first insulating layer 108 and the second insulating layer 110 to cover the component area 102. In this embodiment, the electromagnetic shield 112 is formed directly on the second insulating layer 110 and conforms to the shape of the second insulating layer 110. A section 158 of the metallic structure 114 is uncovered by the first insulating layer 108 and the second insulating layer 110 and the lateral portions 142 of the electromagnetic shield 112 extend onto the section 158 of the metallic structure 114 to provide the electromagnetic shield 112 with a path to ground. Thus, the first insulating layer 108 and the second insulating layer 110 isolate the electromagnetic shield 112 from the electronic component 106.

FIGS. 6A-6K illustrates steps for manufacturing the electronic module 94 in FIG. 5. Note that FIGS. 6A-6K describe one embodiment for manufacturing the electronic module 94 and additional steps, different steps, and/or steps in a different order than the steps described herein may be utilized to manufacture the electronic module 94 as well as other embodiments of the electronic module. Also, note that throughout FIGS. 6A-6K certain elements have not been labeled with a numeral although analogous elements have been labeled with the numeral. (For example, in FIG. 6A only some of the conductive pads on the component area 102 have been labeled as "146" and in FIG. 6B only some of the conductive pads on the electronic component 106 have been labeled as "148"). This has been done for the sake of clarity.

Figure 6A:
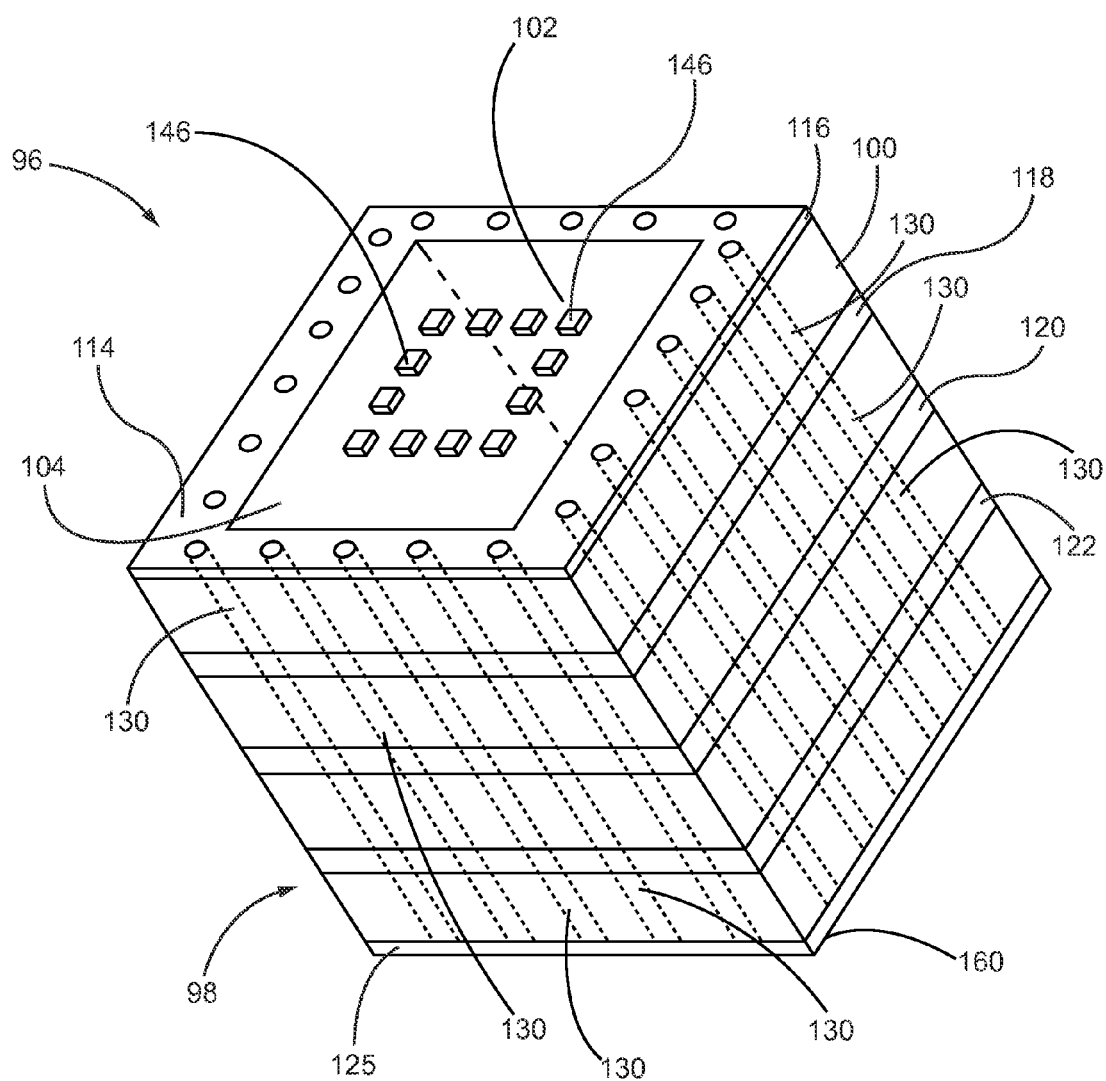
FIGS. 6A-6K illustrate steps associated with one embodiment of a method for manufacturing the fourth embodiment of the electronic module illustrated in FIG. 5.

To manufacture the electronic module 94, the substrate 96 is provided having the substrate body 98 that defines the component portion 100 (FIG. 6A). The component portion 100 of the substrate 96 has the component area 102 on the surface 104 of the substrate 96. The metallic structure 114 extends along the periphery 126 (shown in FIG. 5) of the component portion 100 and the first metallic layer 116 of the metallic structure 114 extends along the periphery 128 (shown in FIG. 5) of the component area 102. The conductive vias 130 and the second metallic layer 118, the third metallic layer 120, and the fourth metallic layer 122 connect the first metallic layer 116 to the grounding plate 125. If required, a bottom surface 160 of the grounding plate 125 may be taped (not shown) to protect the bottom surface 160 from contaminants. The conductive vias 130 are discrete from one another and thus do not fully surround the periphery 126 (shown in FIG. 5) of the component portion 100. Consequently, gaps between the conductive vias 130 are exposed.

However, conductive vias 130 may be provided close enough to one another so as to present an electromagnetic barrier to the electromagnetic emissions. The conductive pads 146 on the component area 102 are provided so that the conductive pads 146 are adjacent to and are formed around the periphery of the electronic component 106.

Figure 6B:
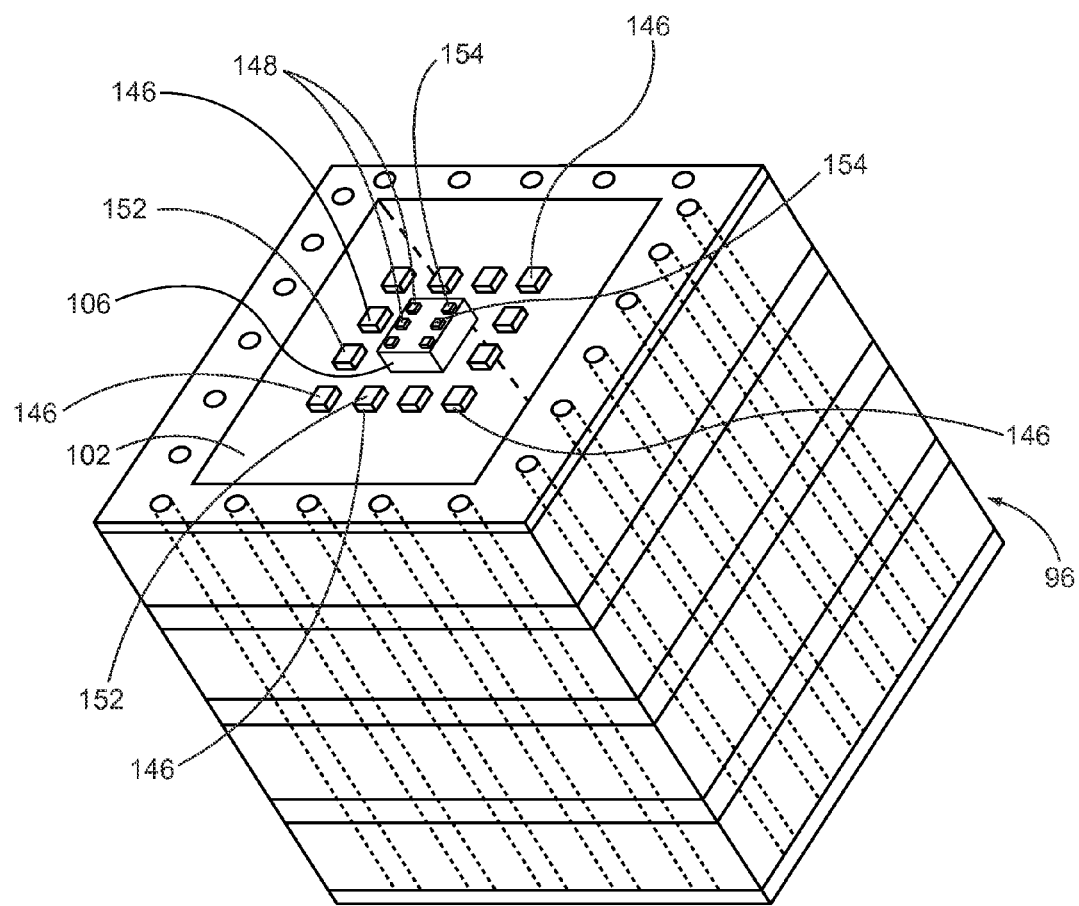

Next, the electronic component 106 is attached on the component area 102 (FIG. 6B). The electronic component 106 includes the conductive pads 148. The electronic component 106 may be attached on the component area 102 using an attachment material, such as an epoxy, solder, or the like. This attachment material may be cured and the substrate 96 may then be cleaned using a plasma cleaning process.

Figure 6C:
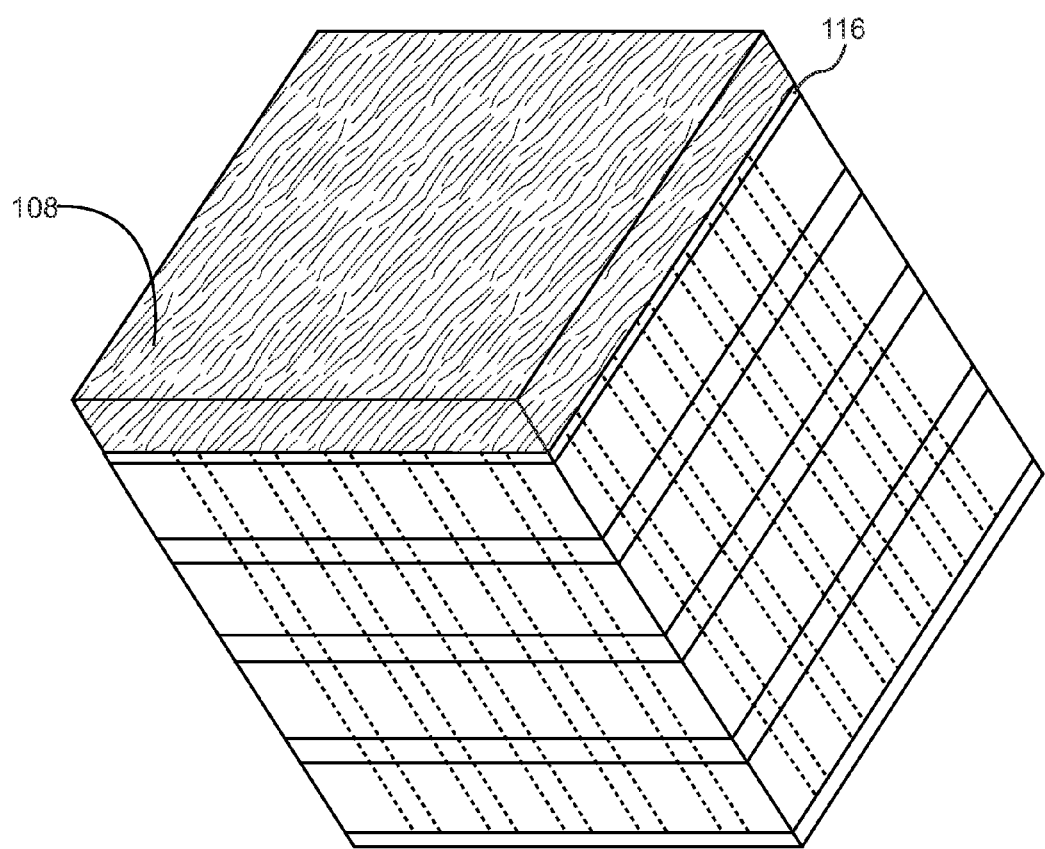

Referring now to FIG. 6B and FIG. 6C, the first insulating layer 108 is provided by coating a dry film over the component area 102 (FIG. 6C). The first insulating layer 108 should at least cover the electronic component 106 and the conductive pads 146 on the component area 102. In this manner, the electronic component 106 may be isolated from the electromagnetic shield 112 (shown in FIG. 5). Also, the traces 156A, 156B (shown in FIG. 5) formed by the conductive layer 150 (shown in FIG. 5) may be isolated from the substrate 96. In this example, the first insulating layer 108 is coated to cover the entire component area 102 and coats the first metallic layer 116.

Figure 6D:
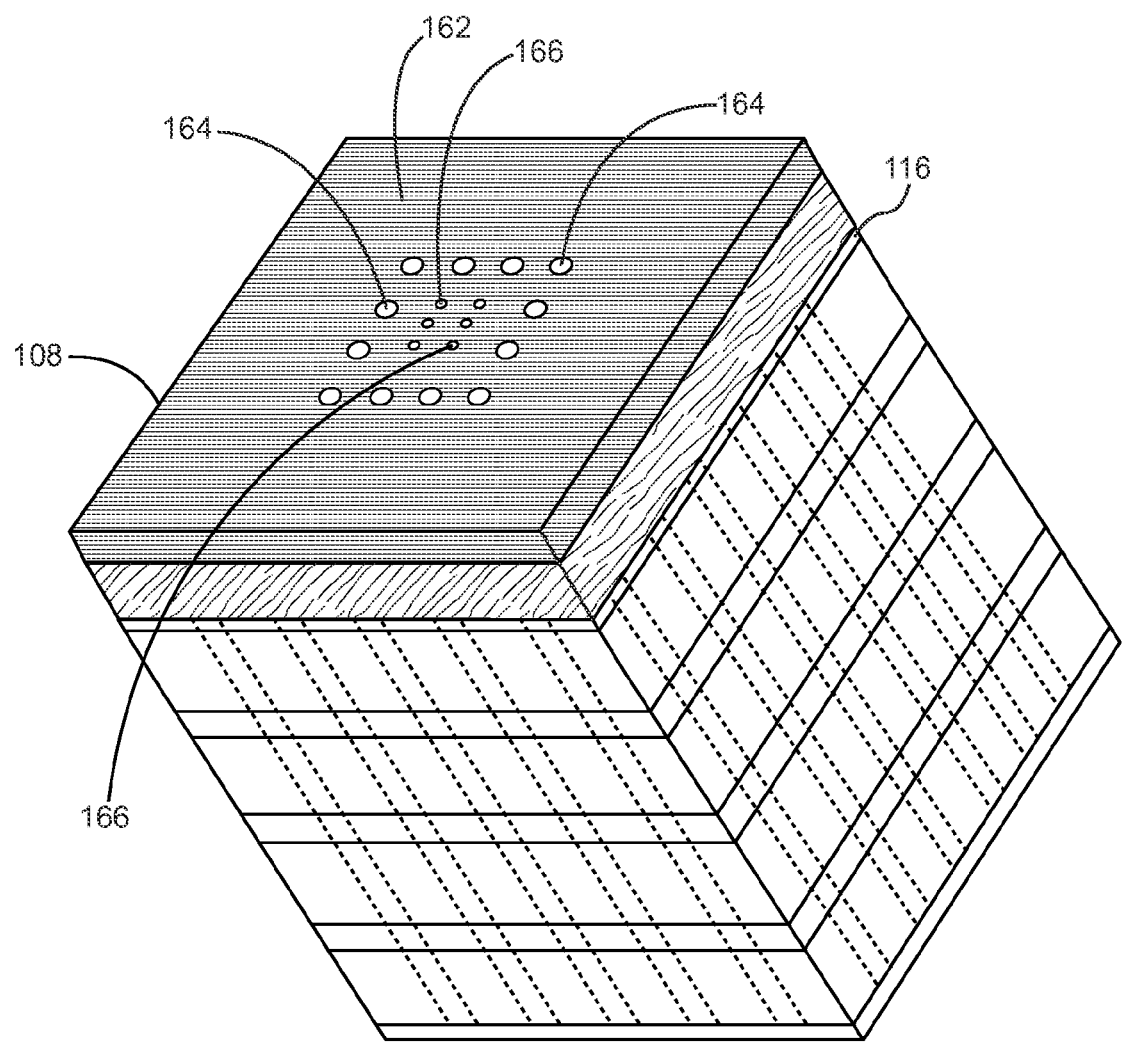

Referring now to FIG. 6B and FIG. 6D, plasma etching may then be utilized to shape the first insulating layer 108. A mask 162 is placed over the first insulating layer 108 (FIG. 6D). The mask 164 is aligned so that openings 164 are aligned directly over the sections 152 (shown in FIG. 6B) of each of the conductive pads 146 on the component area 102. In addition, the mask 164 has openings 168 that are aligned directly over the sections 154 (shown in FIG. 6B) of the conductive pads 148 of the electronic component 106. The openings 164 in the mask 162 illustrated in FIG. 6D are dimensioned so that segments of the first insulating layer 108 on top of the sections 152 are plasma etched. Openings 166 ensure that sections of the first insulating layer 108 on top of sections 152, 154 are plasma etched. In this manner, the conductive layer 150 (shown in FIG. 5) can form connections between the conductive pads 146, 148.

Plasma is then created from a plasma source to perform the plasma etch. The plasma source may be a gas such as carbon tetraflouride (CF4), hexaflourosilicate anion (SiF6), nitrogen triflouride (NF3), and the like. The plasma is then applied to the first insulating layer 108 through the mask 162 which etches the first insulating layer. The mask 162 can then be removed and the sections 152 (shown in FIG. 6B) of the conductive pads 146 and the sections 154 (shown in FIG. 6B) of the conductive pads 148 are exposed through the first insulating layer 108 by the plasma etching (FIG. 6E).

Figure 6E:
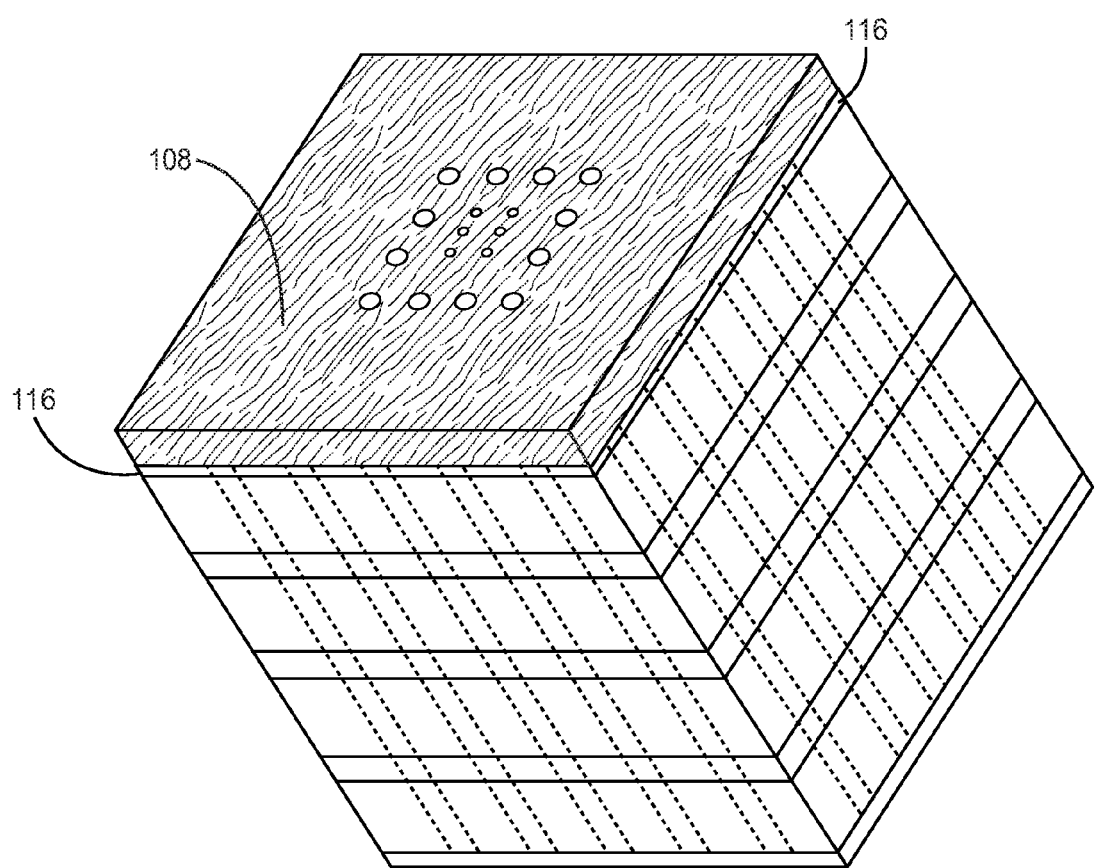
Figure 6F:
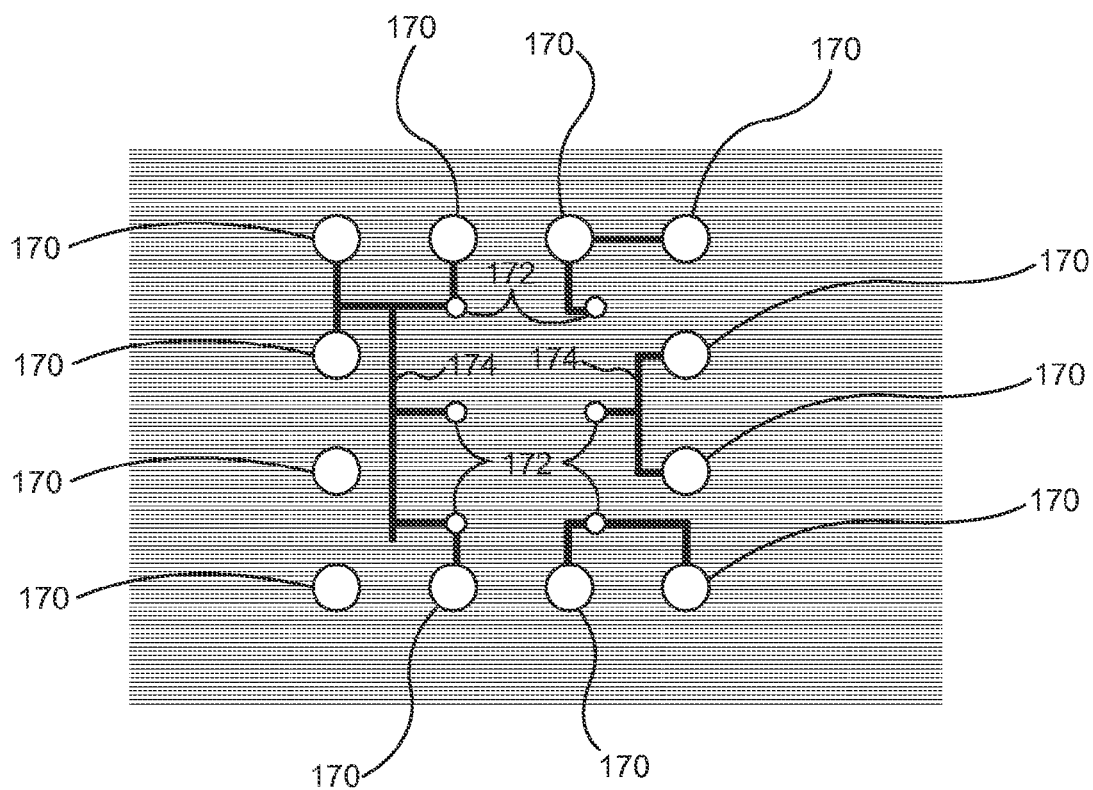
Figure 6G:
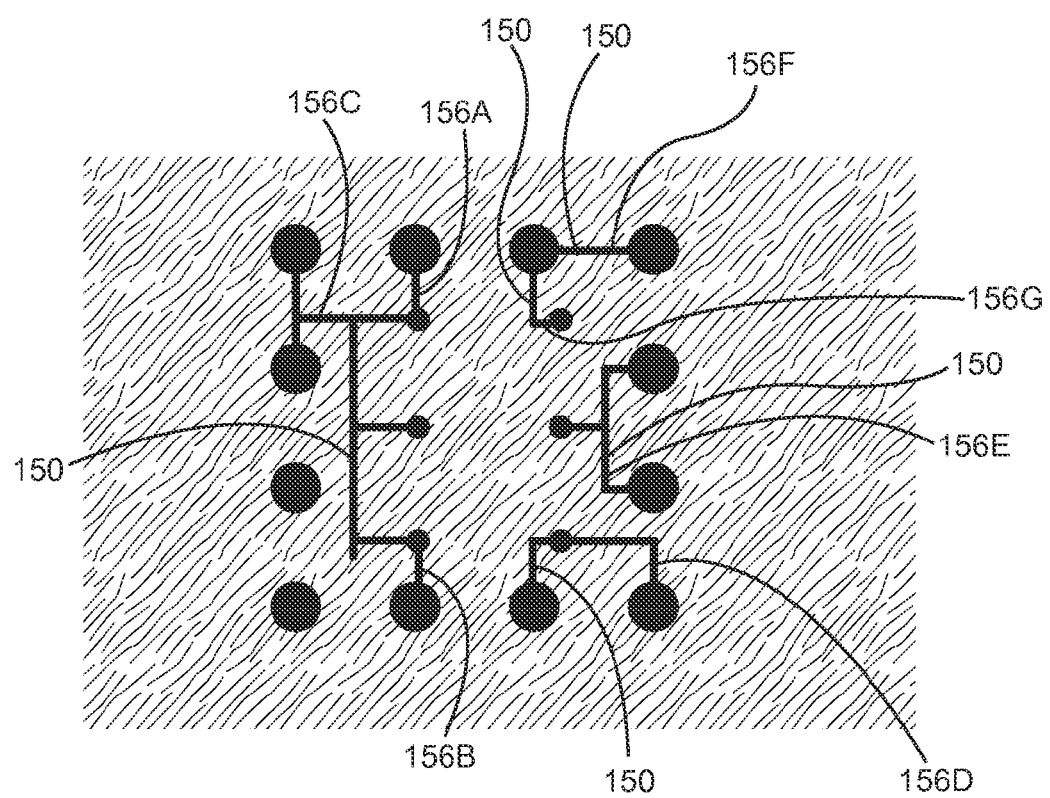
Figure 6H:
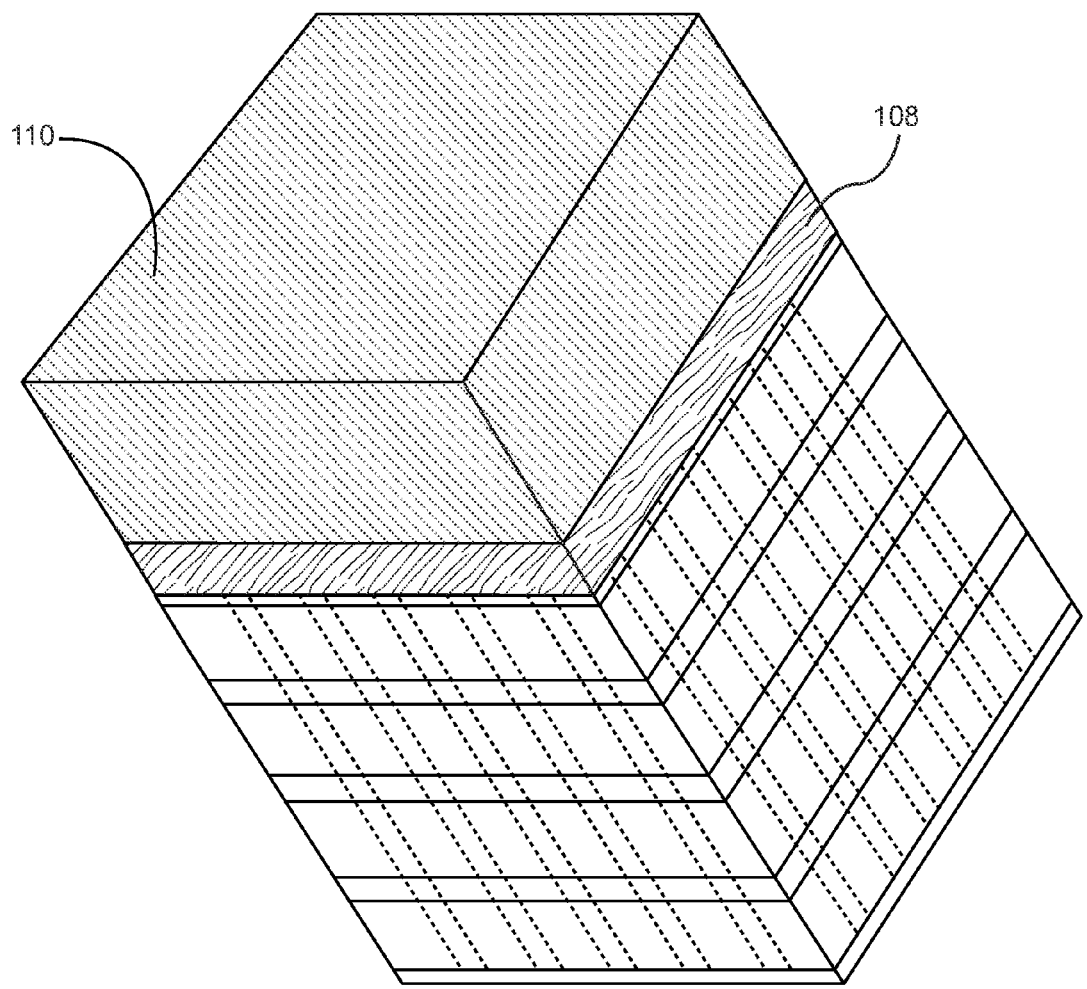

Referring now to FIGS. 6E and 6F, once the sections 152 of the conductive pads 146 and the sections 154 of the conductive pads 148 have been exposed, a second mask 168 is provided over the first insulating layer 108 (FIG. 6F). The mask 168 includes openings 170 formed over the exposed sections the sections 152 (shown in FIG. 6B) of the conductive pads 146. The openings 172 are provided on the mask 164 over the exposed sections 154 (shown in FIG. 6B) of the conductive pads 148. Openings 174 are provided and shaped as traces. A conductive seed layer is applied over the mask 164 that covers the component area 102 (shown in FIG. 6A). The mask is then removed (FIG. 6G). The conductive layer 150 (shown in FIG. 5) is then applied over the conductive seed layer to provide traces 156A-156G. Accordingly, the conductive layer 150 may be shaped as a RDL layer to route the connections within the electronic module 94 (shown in FIG. 5). In this manner, the conductive layer 150 may be formed so as to be shaped as traces 156A-156G by the electroplating. In yet another alternative embodiment, the conductive seed layer may cover the entire component area wherein plasma etching is used to form traces 156A-156G. However, additional cleaning processes may be required so that the conductive material does not contaminate the first insulating layer 108.

The conductive seed layer may be formed from an adhesive material in combination with a metallic material. The adhesive material may be made from materials such as titanium (Ti), a titanium tungsten alloy (TiW), or the like. The metallic material of the conductive seed layer may be made from any type of metal such as copper (Cu), gold (Au), silver (Ag), Nickel (Ni), aluminum (Al), and/or the like. The metallic material may also be a metallic alloy made from various metals and/or a metal chemically bonded to a non-metal that has metallic properties.

Figure 6I:
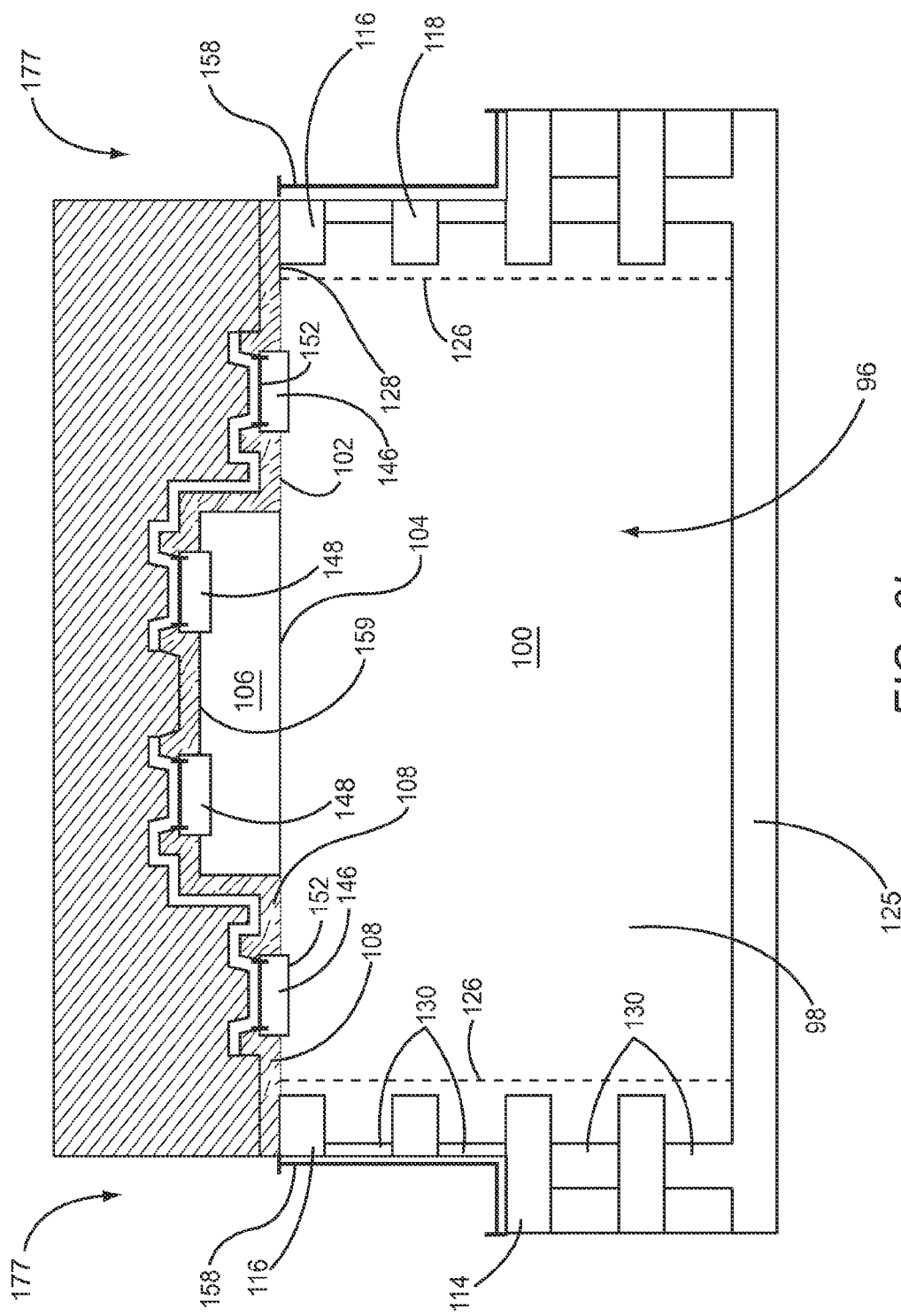
Figure 6J:
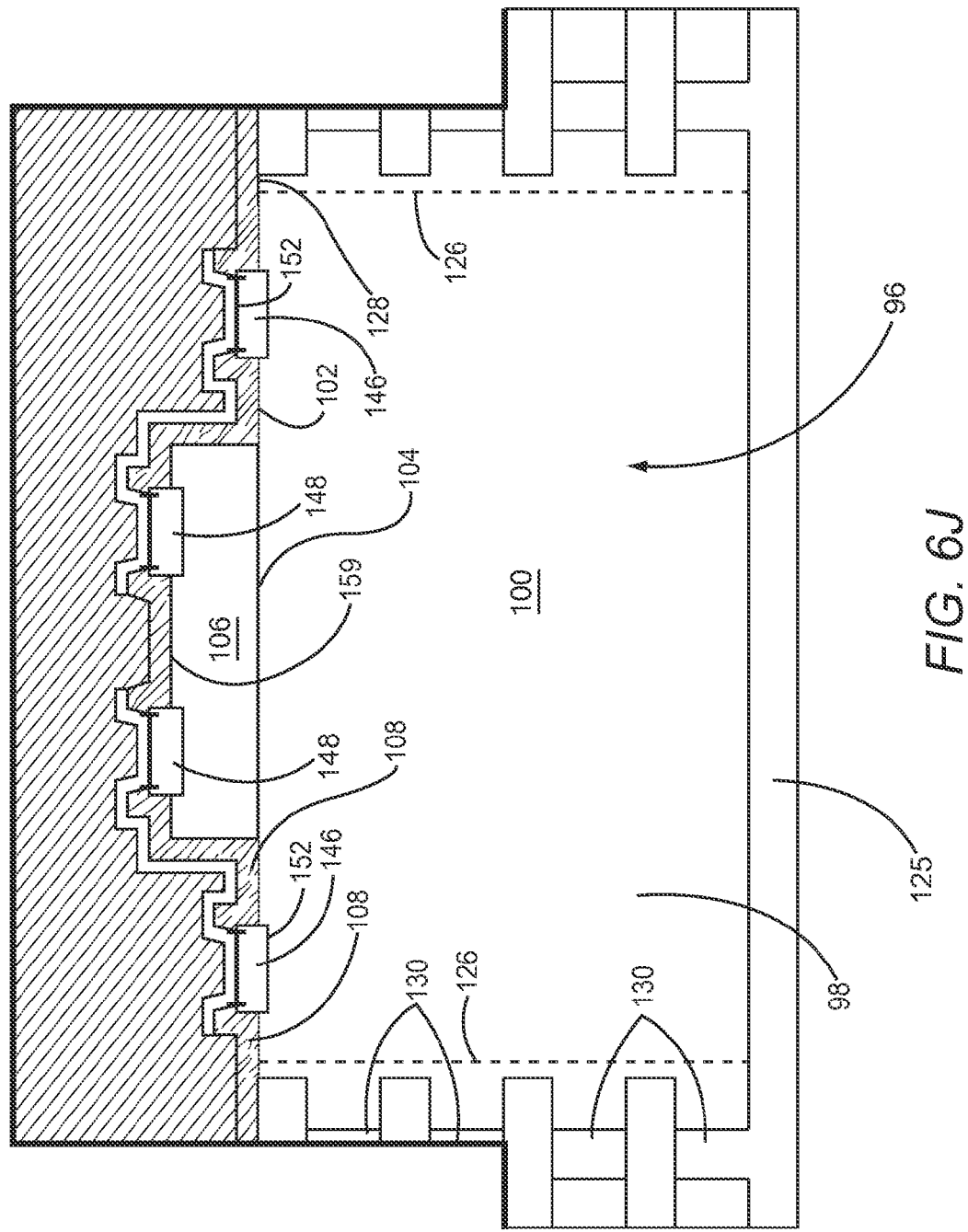

Next, the second insulating layer 110 is provided over the first insulating layer 108 (FIG. 6I). The second insulating layer 110 should be provided to at least cover the conductive layer 150 and in this case covers the entire component area 102 (shown in FIG. 6H). The second insulating layer 110 thus electromagnetically isolates the traces 156A-156G to reduce or eliminate the electromagnetic interference. In this embodiment, the second insulating layer 110 covers the entire component area 102 (shown in FIG. 6A) and is an overmold. A cut is made through the second insulating layer 110 to create an opening 177 along the periphery 128 (shown in FIG. 5) of the component portion 100 that exposes the section 158 of the metallic structure 114 (FIG. 6I). The opening 177 may be made to extend into the component portion 100 to expose the first metallic layer 116, second metallic layer 118, vias 130 associated with the first and second metallic layer 116, 118, and the third metallic layer 120, are exposed through the opening 177. In alternative embodiments, any other combination or sub-combination of the grounding elements in the metallic structure 114 may be exposed by the opening 177.

Figure 6K:
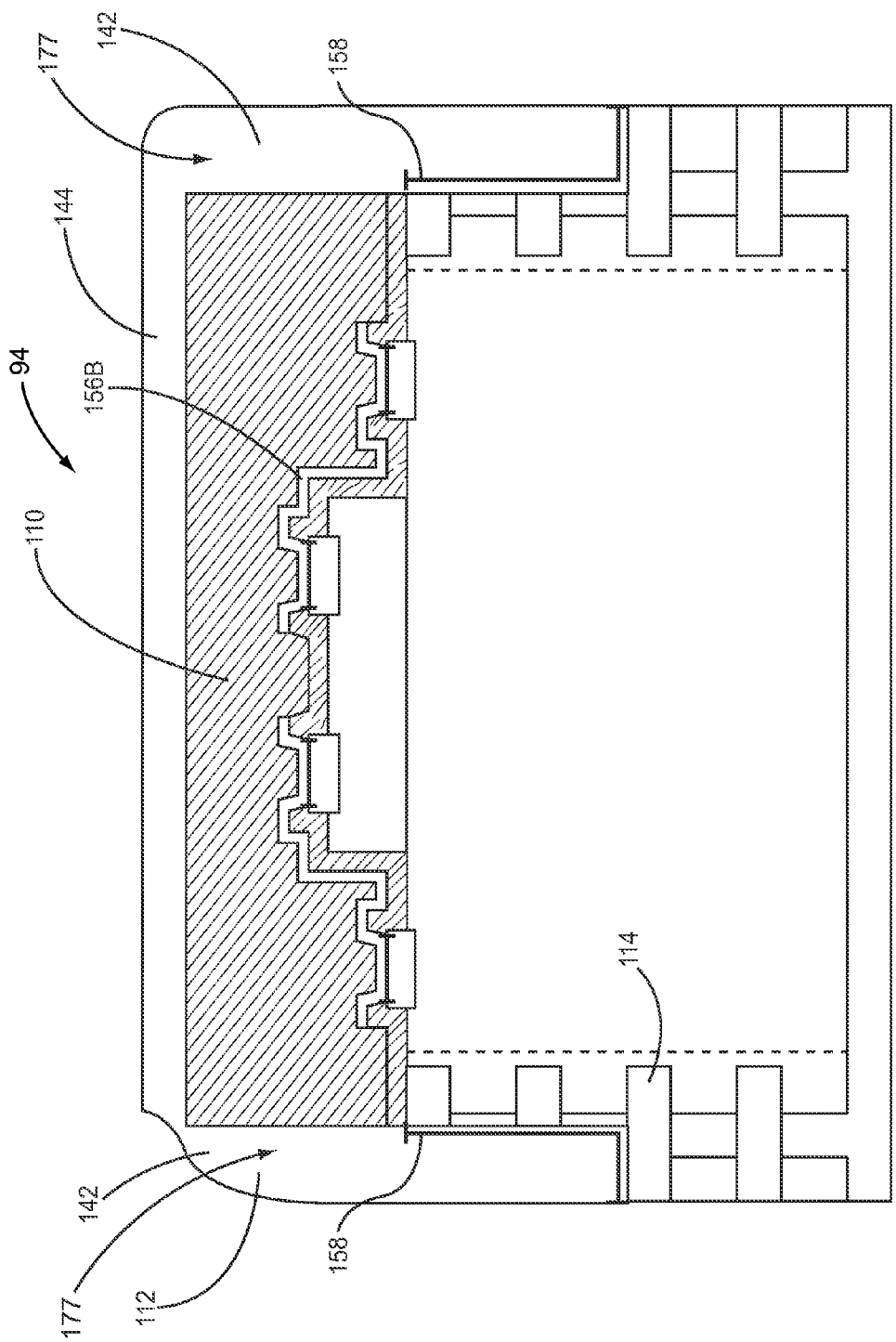

A conductive seed layer is then applied over the component area 102 (FIG. 6J) An electromagnetic shielding material may then be applied over the second insulating layer 110 and the first insulating layer 108 to create the electronic module 94 with the electromagnetic shield 112 formed over the component area 102 (FIG. 6K). In this embodiment, the top portion 144 of the electromagnetic shield 112 covers the entire component area 102 and is attached on the second insulating layer 110. The electromagnetic shielding material is also applied within the opening 177 to form the lateral portions 142 of the electromagnetic shield 112. The lateral portions 142 extend downward through the opening 177 and attach the electromagnetic shield 112 to the section 158 of the metallic structure 114. In this manner, the electromagnetic shield 112 may be grounded.

Figure 7:
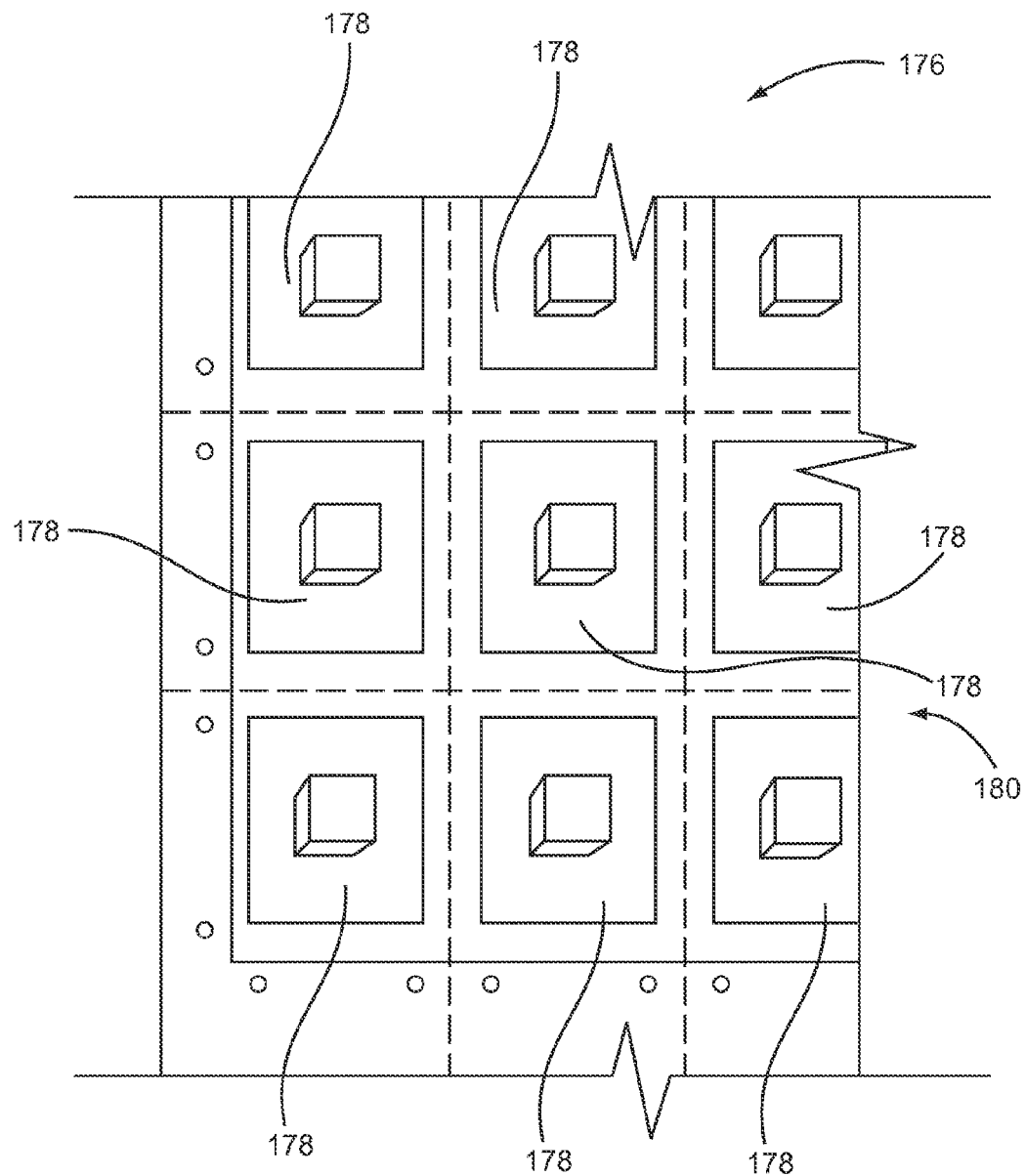
FIG. 7 illustrate one embodiment of an electronic meta-module that includes a plurality of electronic modules in accordance with this disclosure.

Referring now to FIG. 7, one embodiment of an electronic meta-module 176 having a plurality of shielded electronic modules 178 is shown. In this example, the plurality of shielded electronic modules 178 is arranged as an array 180 of shielded electronic modules 178. The array 180 may be of any shape, however, in this example, the array 180 is a rectangular array that arranges the plurality of shielded electronic modules 178 in rows and columns.

Figure 8:
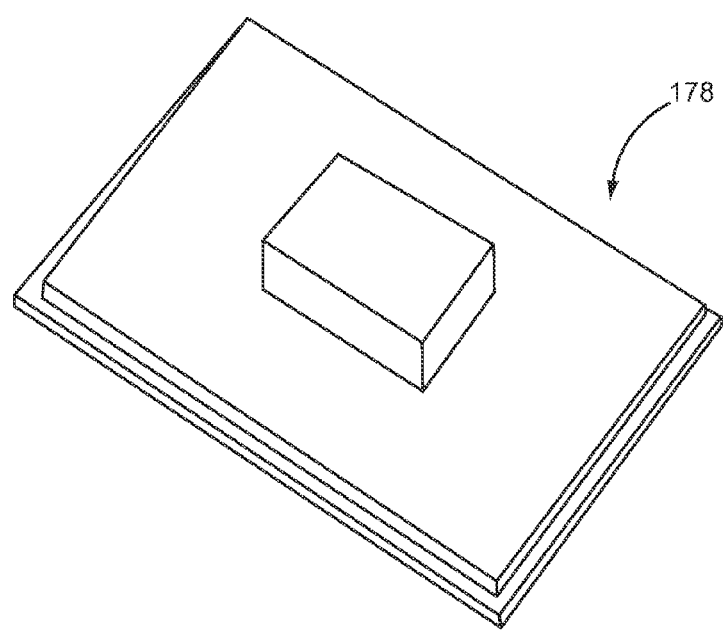
FIG. 8 illustrates one of the electronic modules that has been singulated from the electronic meta-module shown in FIG. 7.

As shown in FIG. 8, these shielded electronic modules 178 may be singulated from the electronic meta-module 176 to provide individual shielded electronic modules 178.

Figure 9A:
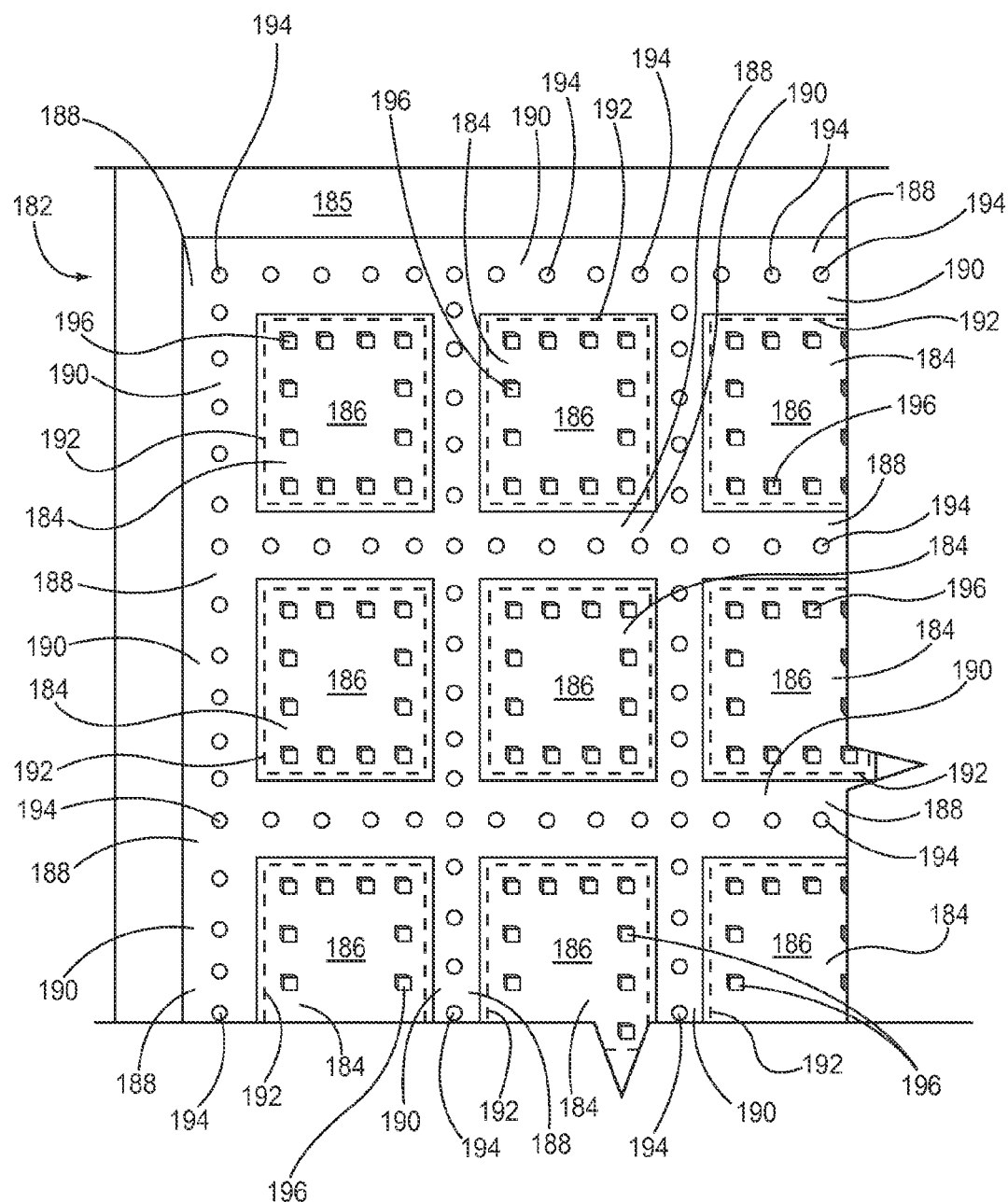
FIGS. 9A-9N illustrate steps associated with one embodiment of a method for manufacturing the electronic meta-module in FIG. 7.
Figure 9B:
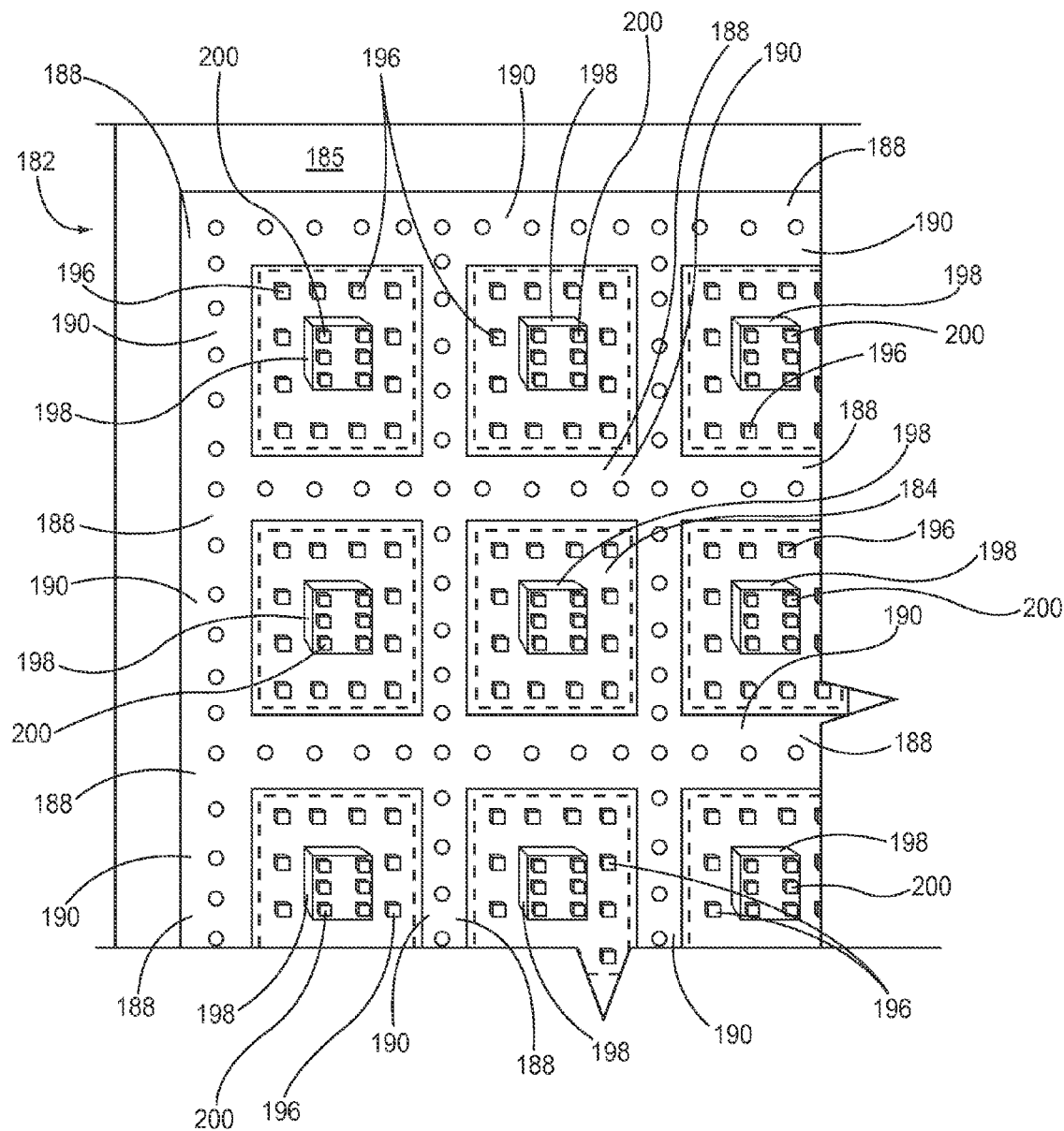
Figure 9C:
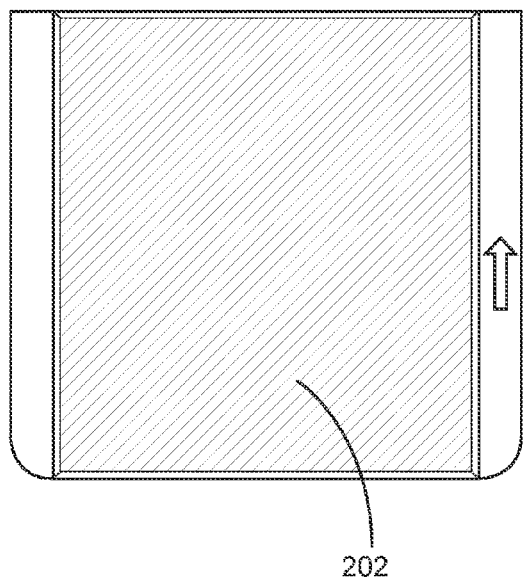
Figure 9D:
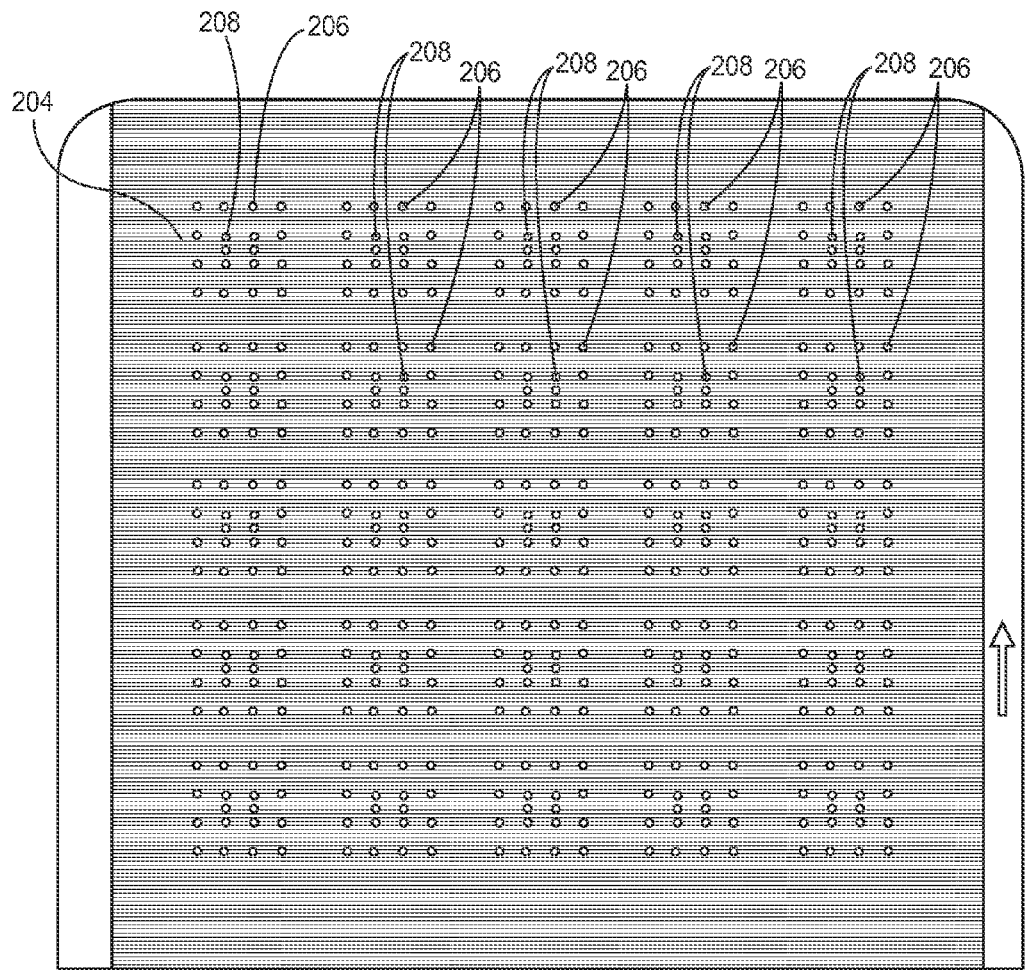
Figure 9E:
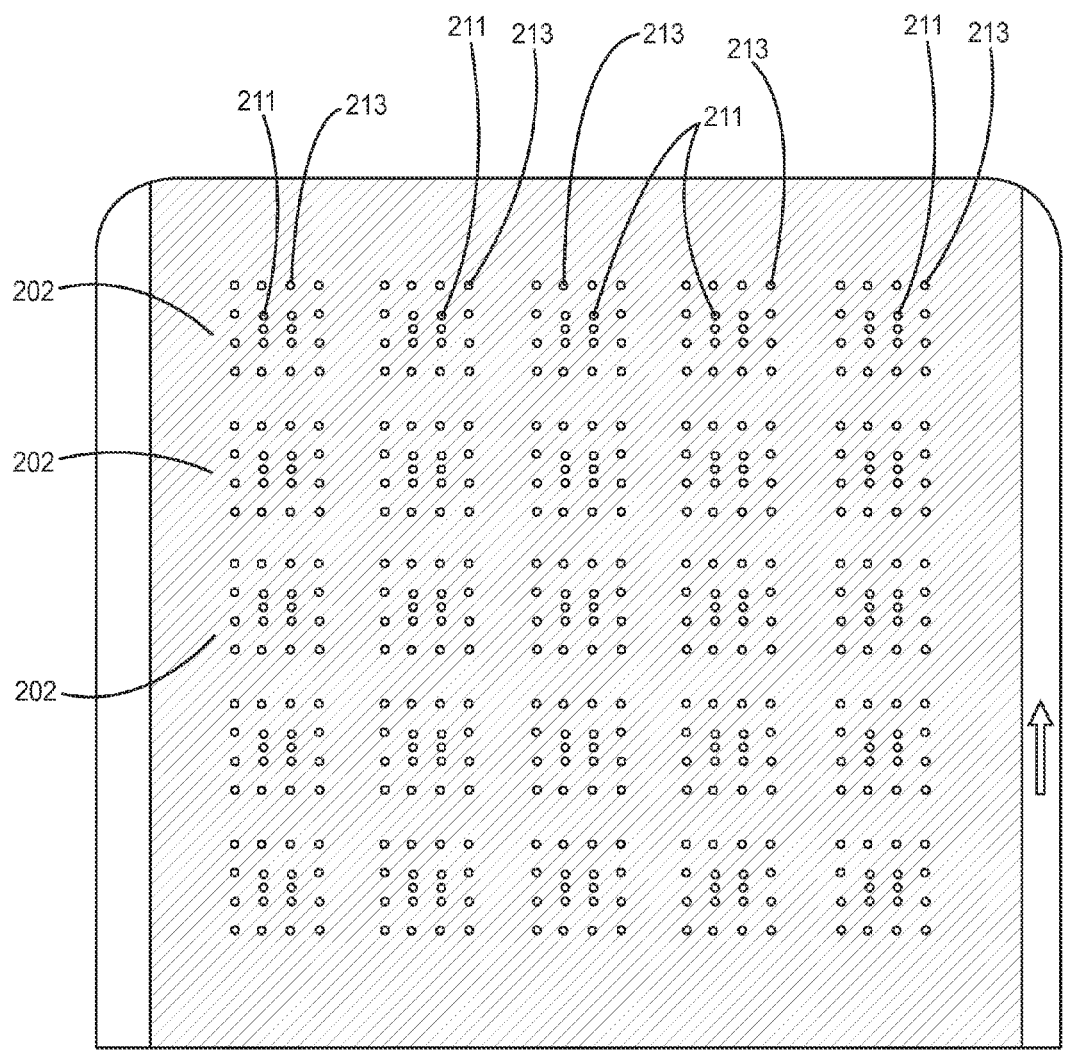
Figure 9F:
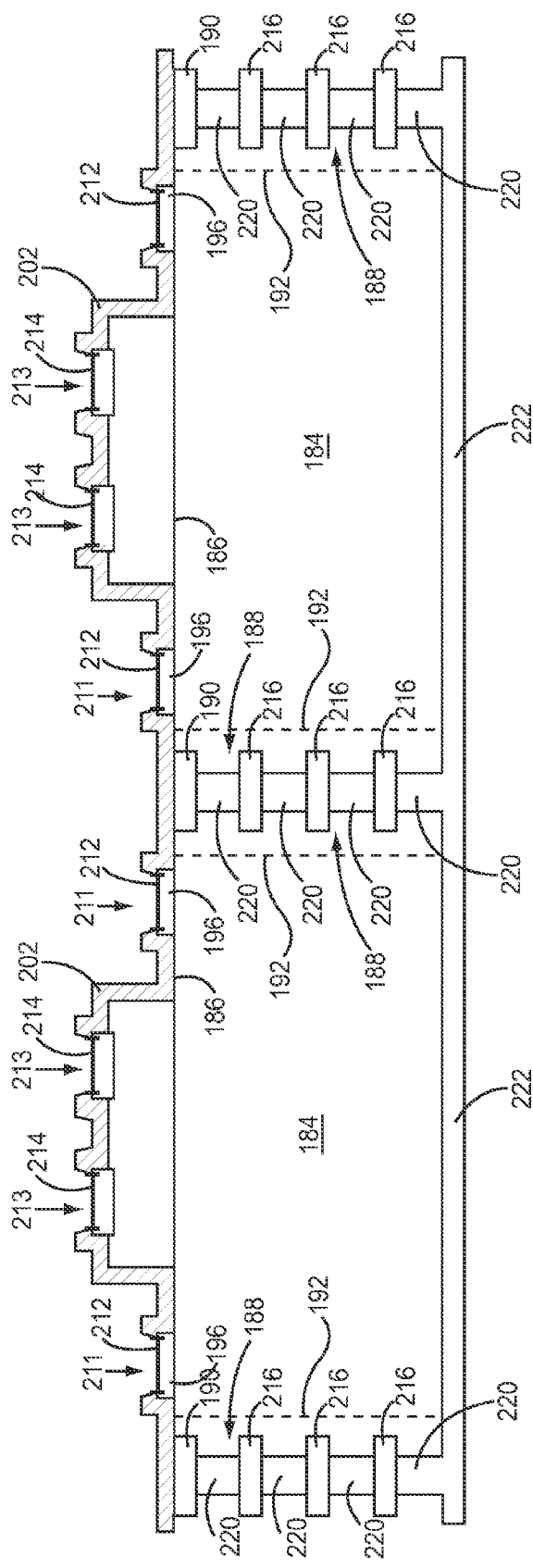
Figure 9G:
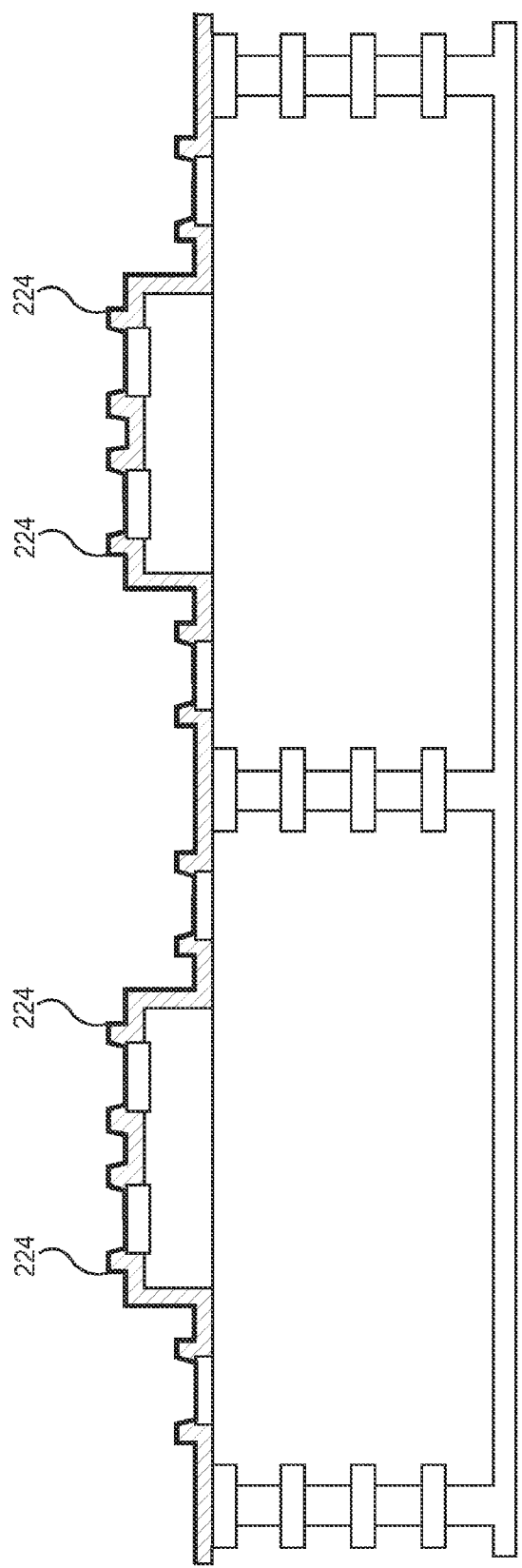
Figure 9H:
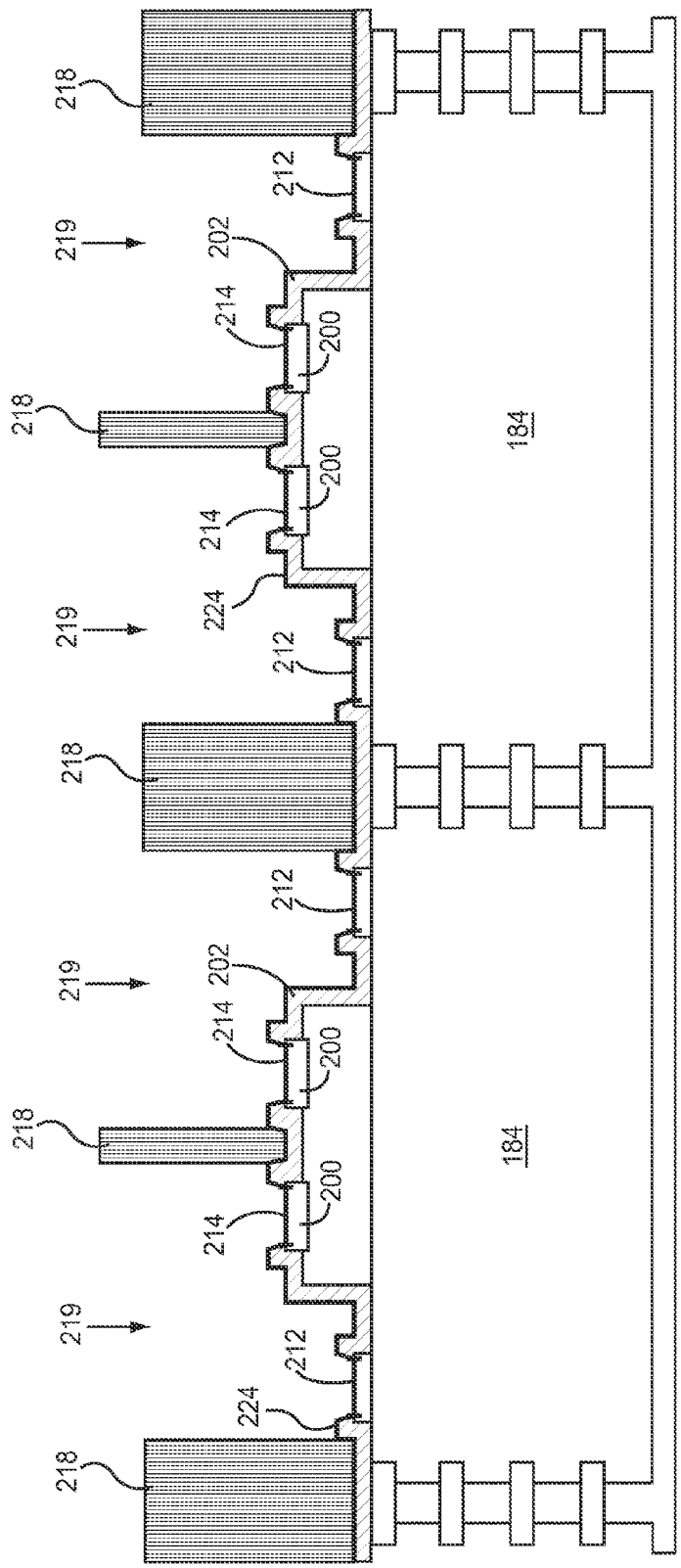
Figure 9I:
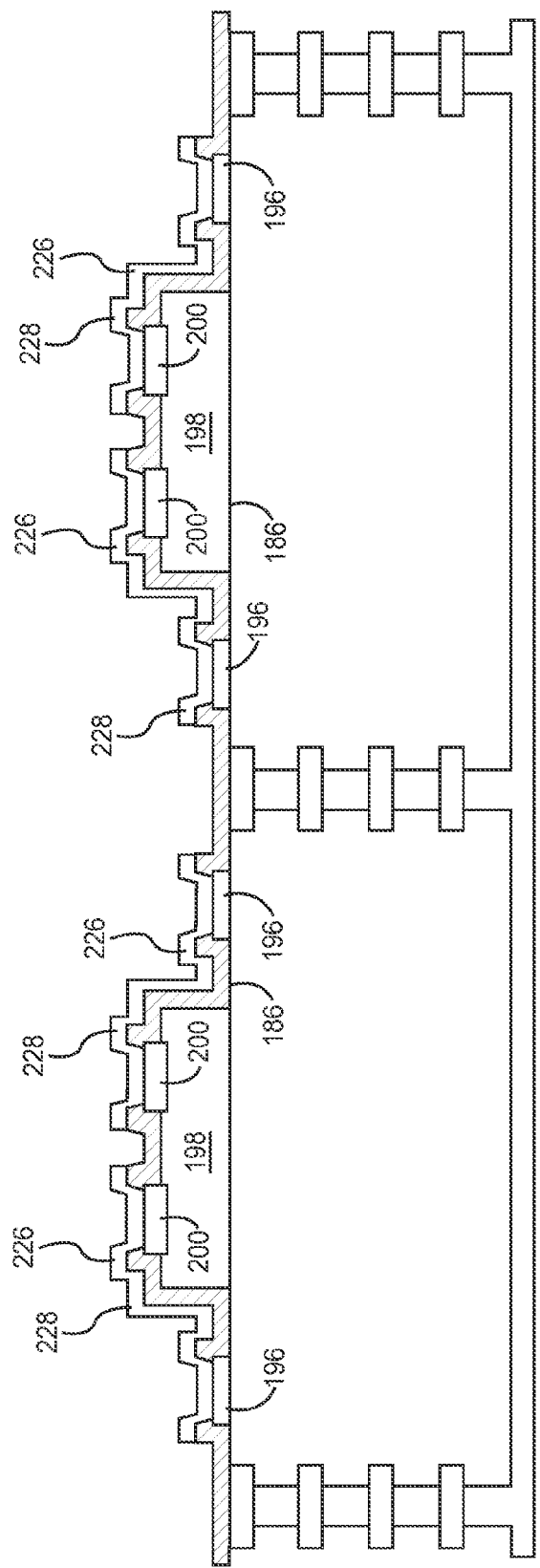
Figure 9J:
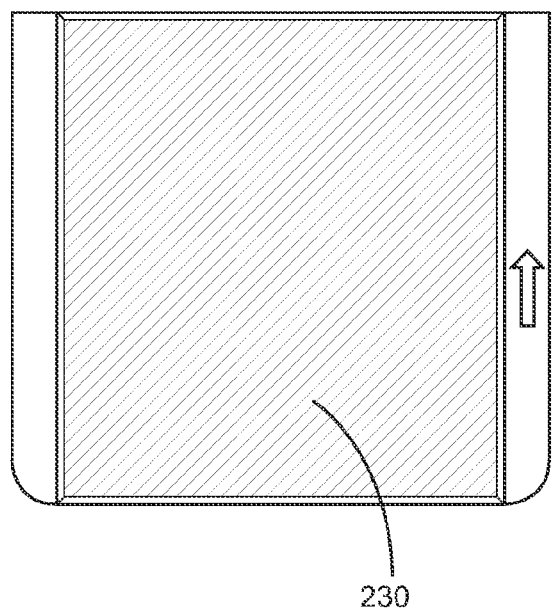
Figure 9K:
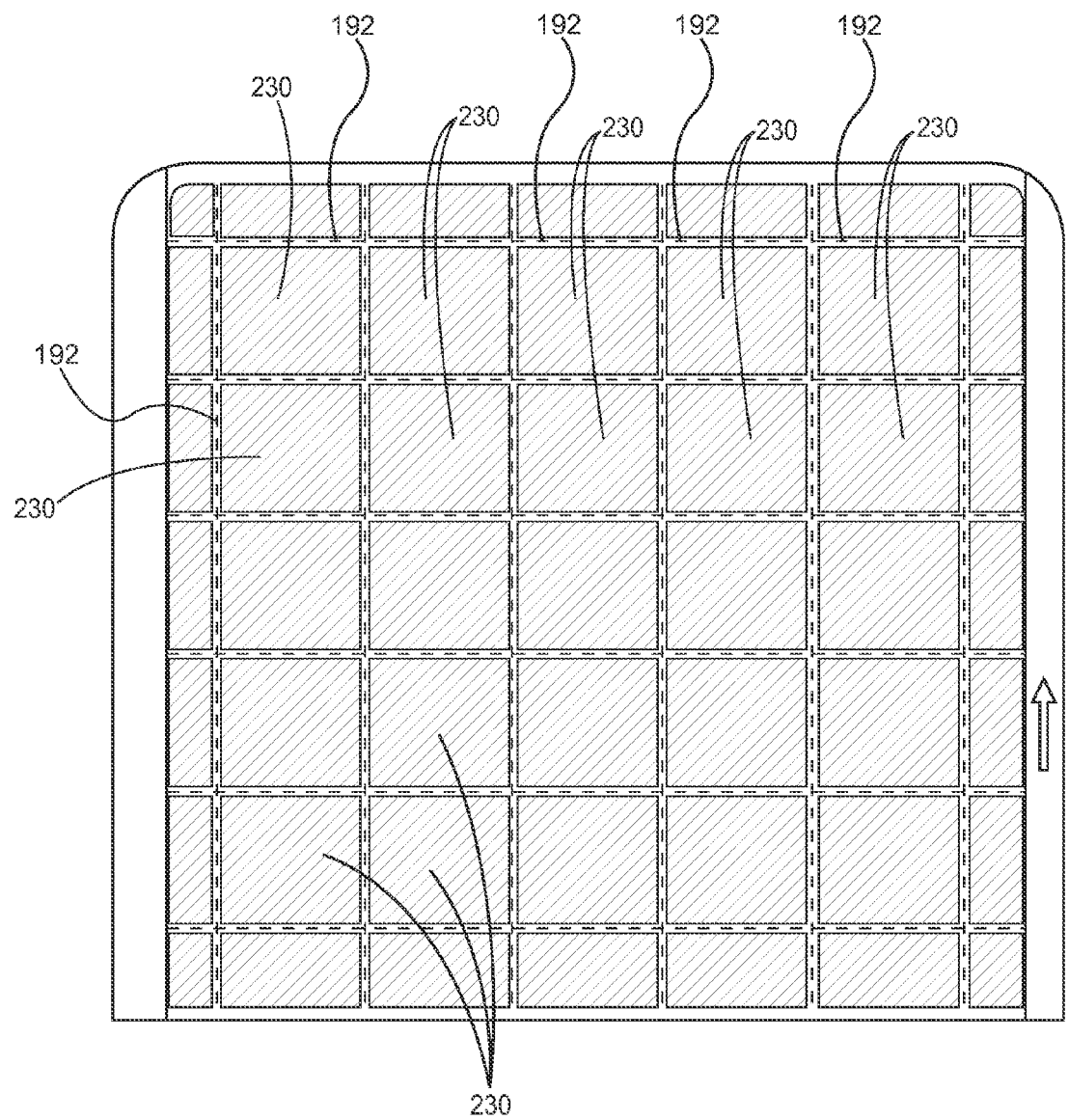
Figure 9L:
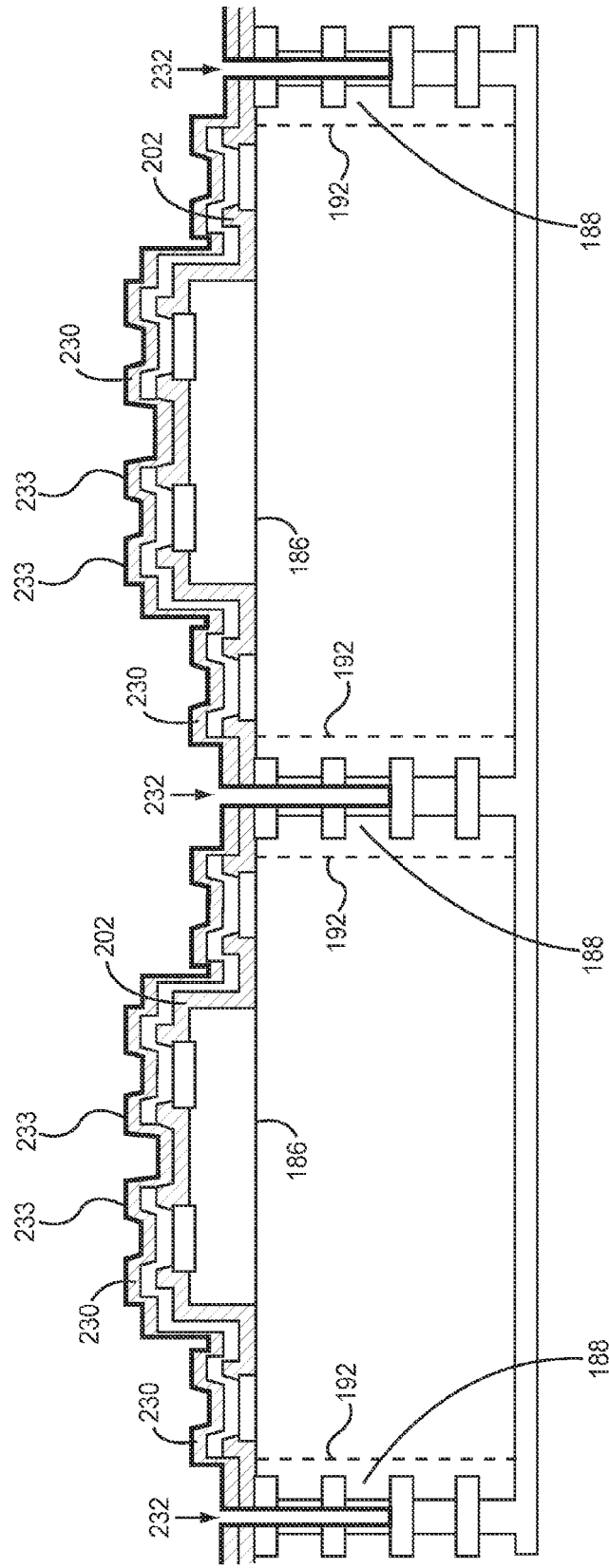
Figure 9M:
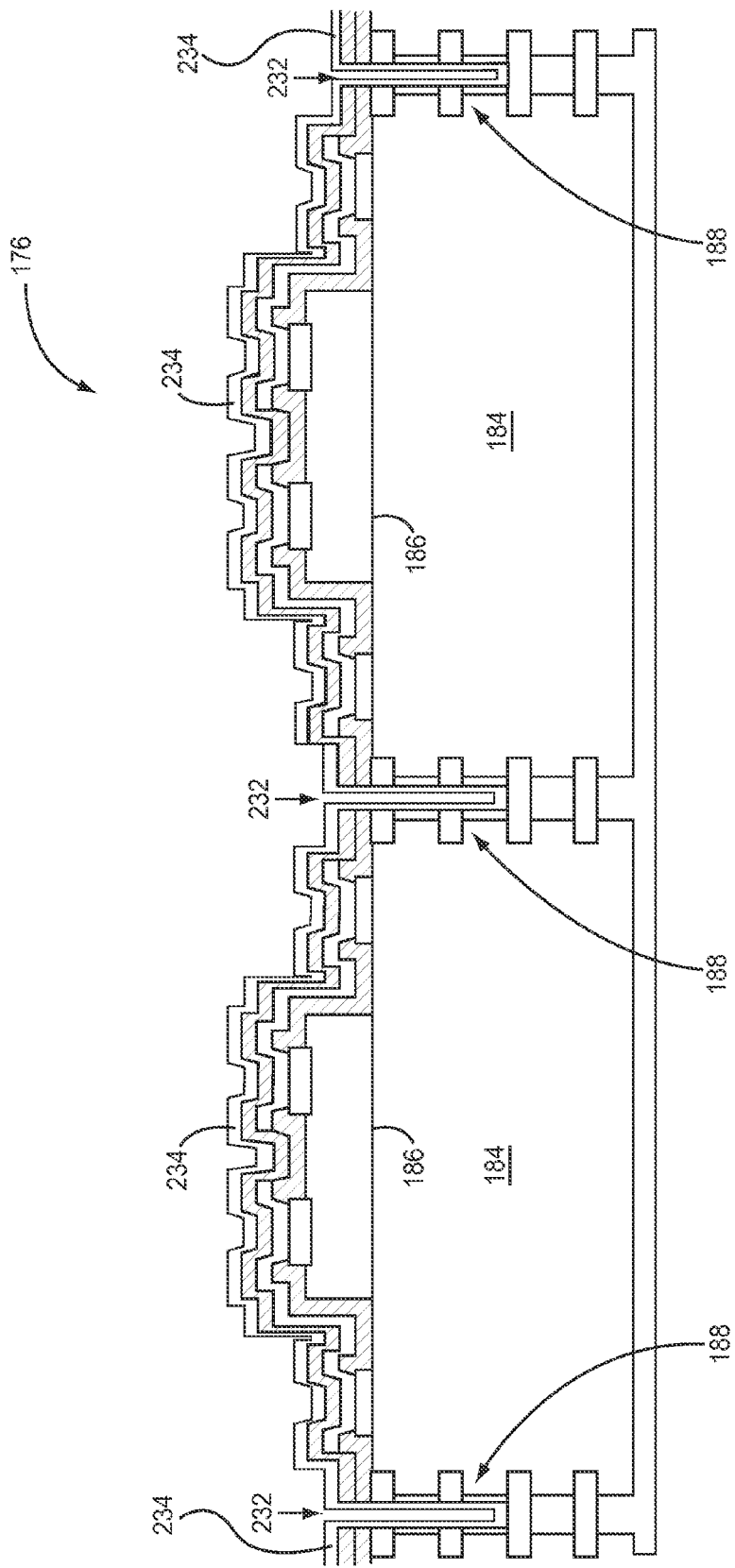
Figure 9N:
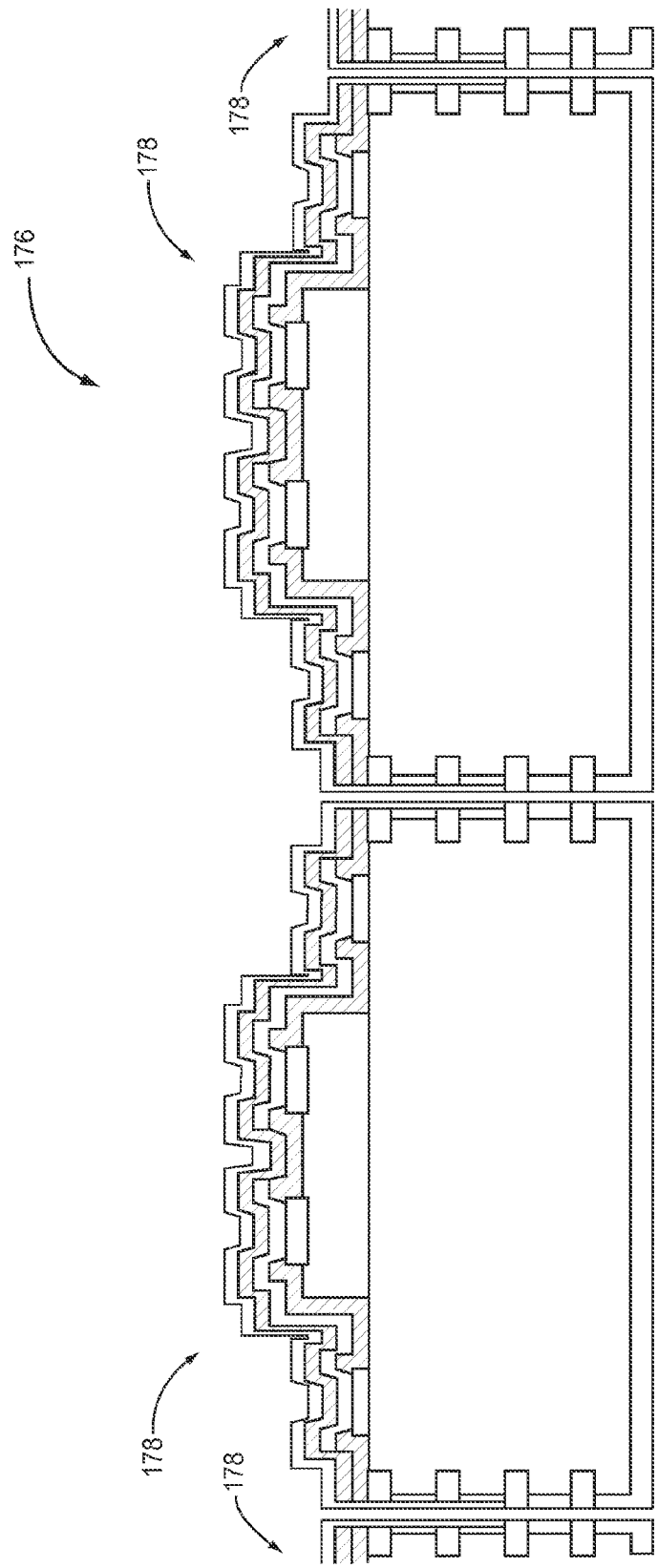

FIGS. 9A-9N illustrates a series of steps for manufacturing the electronic meta-module 176. (Note, throughout FIGS. 9A-9N certain elements have not been labeled with a numeral although analogous elements have labeled with the numeral. This was done for the purposes of clarity). First, a substrate 182 may be provided that has a substrate body, which defines a plurality of component portions 184 (FIG. 9A). On a surface 185 of the substrate 182, each component portion 184 may have a component area 186 and a metallic structure 188 that extends along a periphery of the component portion 184. FIG. 9A illustrates a metallic layer 190 of each of the metallic structures 188 that surrounds a periphery 192 of each of the component areas 186. Also, conductive vias 194 are positioned on the metallic layer 190 along the periphery 192 of each the component areas 186 as grounding elements. The conductive vias 194 in FIG. 9A extend above the component areas 186. The component areas 186 also each include a set of conductive pads 196, which may be utilized to form internal or external connections.

Next, one or more electronic components 198 may be attached on each component area 186 (FIG. 9B). The electronic components 198 may each have a set of conductive pads 200 and may be attached on the component areas 186 using an attachment material, such as an epoxy, solder, or the like. This attachment material may be cured and the substrate 182 may then be cleaned using a plasma cleaning process. The plasma source for the plasma used in the plasma cleaning process may be a gas made from argon (Ar), oxygen (O), hydrogen (H), and/or nitrogen (N) and the like, which may be provided in a chamber at a low or at atmospheric pressures. High frequency voltages may be applied to the plasma source to ionize the gas and thereby create the plasma. The plasma is then applied over the component area 186. The plasma and the electromagnetic radiation created by the plasma interact with contaminants to remove them from the substrate 182. However, other types of cleaning techniques, such as wet cleaning techniques, may be utilized depending on the composition of the materials utilized to attach the electronic components 198.

Referring now to FIG. 9B and FIG. 9C, a first insulating layer 202 is formed over each of the component areas 186 using a dry film (FIG. 9C). The first insulating layer 202 should at least cover the electronic components 198 and the conductive pads 200. In this example, the first insulating layer 202 is coated to covers the entire component area 186 of every component area 186.

Referring now to FIG. 9B and FIG. 9D, plasma etching may then be utilized to shape the first insulating layer 202. A mask 204 is placed over the first insulating layer 202 of each of the component areas 186 (FIG. 9D). The mask 204 is aligned so that a set of openings 206 in the mask 204 are directly over at least a section of each set of the conductive pads 196 on each of the component areas 186. In addition, the mask 204 has a set of openings 208 that are aligned directly over at least a section of the conductive pads 200 of each the electronic components 198.

Plasma is then created from a plasma source to perform the plasma etch. The plasma source may be a gas such as carbon tetraflouride (CF4), hexaflourosilicate anion (SiF6), nitrogen triflouride (NF3), and the like. The plasma is then applied to the first insulating layer 202 through the mask 204 and etches the first insulating layer 202. The mask 204 can then be removed and, as shown in FIGS. 9E and 9F, the first insulating layer 202 over each of the component areas 186 has a set of openings 211 that expose sections 212 of each of the conductive pads 196 and a set of openings 213 that expose sections 214 of each of the conductive pads 198. In alternative embodiments, other etching techniques, such as wet etching techniques, may be utilized depending on the materials used to form the first insulating layer 202.

As shown in FIG. 9F, the metallic structures 188 extend about the periphery 192 of each of the component portions 184. Other metallic layers 216 are also provided in the metallic structure 210 within the component portions 184 that extend about the periphery 192. Attached to the metallic layer 190 and metallic layers 216 are internal conductive vias 220. Each of these internal conductive vias 220 extends between the metallic layers 190, 216 to attach the metallic structures 188 to the grounding plate 222. After singulation, the grounding plate 222 may be attached to a chassis, or the like, to serve as a ground node. Thus, the metallic structures 188 and the elements of the metallic structures 188 may be grounding elements.

Once the sections 212 of the conductive pads 196 and the sections 214 of the conductive pads 200 have been exposed, a conductive seed layer 224 is applied (FIG. 9G). Next, a mask 218 may be placed over the first insulating layer 218 (FIG. 9H). The mask 218 includes a openings 219 that are shaped to form the traces that on the first insulating layer 202. The traces are to be connected to and extend between the exposed sections 212, 214 of the conductive pads 196, 200. After the mask 218 is positioned, a conductive layer 226 is formed over each of the component areas 186 and the mask is removed (FIG. 9I). The conductive layer 226 is shaped as the traces 228.

Next, a second insulating layer 230 is provided over the first insulating layer 202 of each of the component areas 186 (FIG. 9J). The second insulating layer 230 should be provided to at least cover the traces 228. The second insulating layer 230 thus electromagnetically isolates the traces 228 to reduce or eliminate electromagnetic interference. In this embodiment, the second insulating layer 230 covers each of the component areas 186 (shown in FIG. 9A). Next, channels 232 are cut along the periphery of each of the component portions 184 through at least the first and second insulating layers 202, 230 to expose at least a section of the metallic structures 188 (FIGS. 9K, 9L) A conductive seed layer 233 may then be coated over the second insulating layer 230 and within the channels 232. (FIG. 9L). An electromagnetic shielding material may then be electroplated on the conductive seed layer 233 to form electromagnetic shields 234 over each of the component areas 186 (FIG. 9M). The electromagnetic shields 234 are each attached to the sections of the metallic structures 188 within the channels 232. In turn, this creates the electronic meta-module 176 (shown in FIG. 7). Each shielded electronic module 178 may then singulated individual shielded electronic modules 178 from the electronic meta-module 176 (FIG. 9N).

Figure 10A:
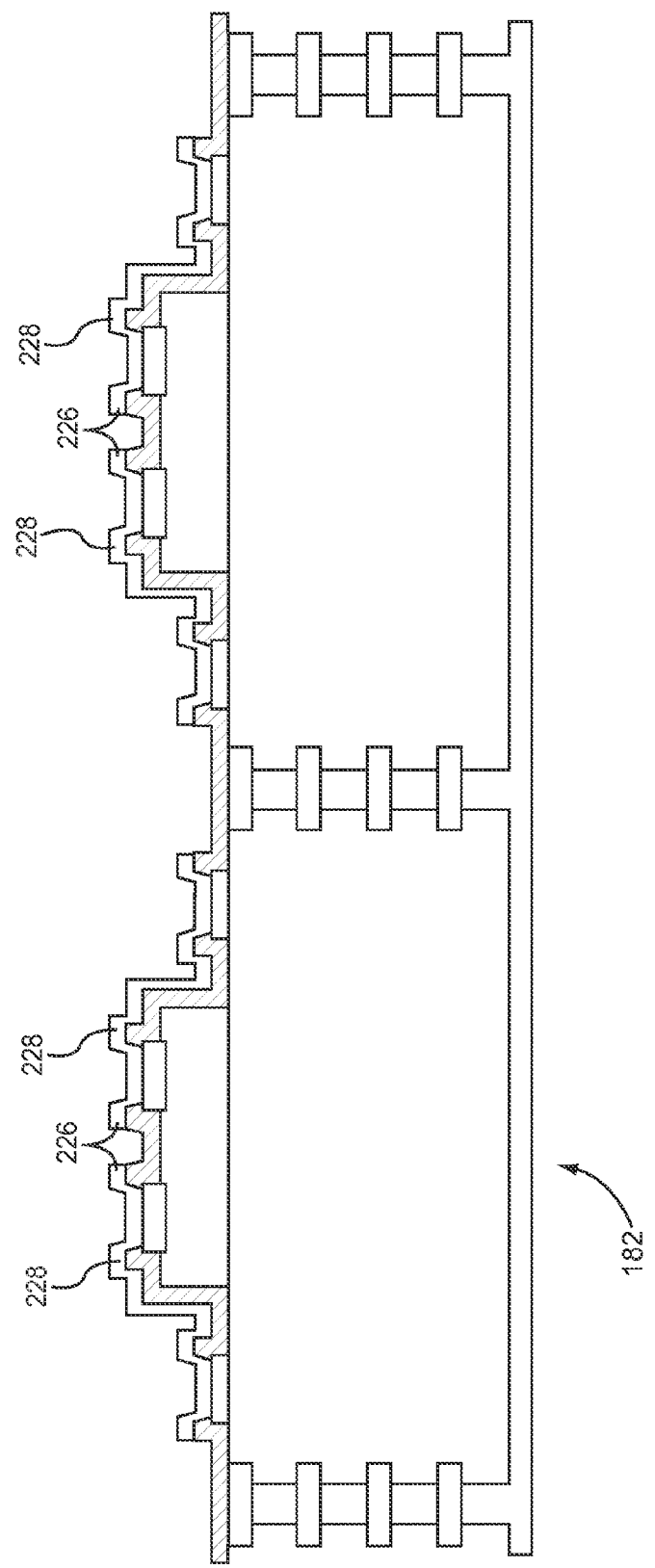
FIGS. 10A-10E illustrate steps associated with one embodiment of a method of manufacturing another embodiment of an electronic meta-module in accordance with this disclosure.
Figure 10B:
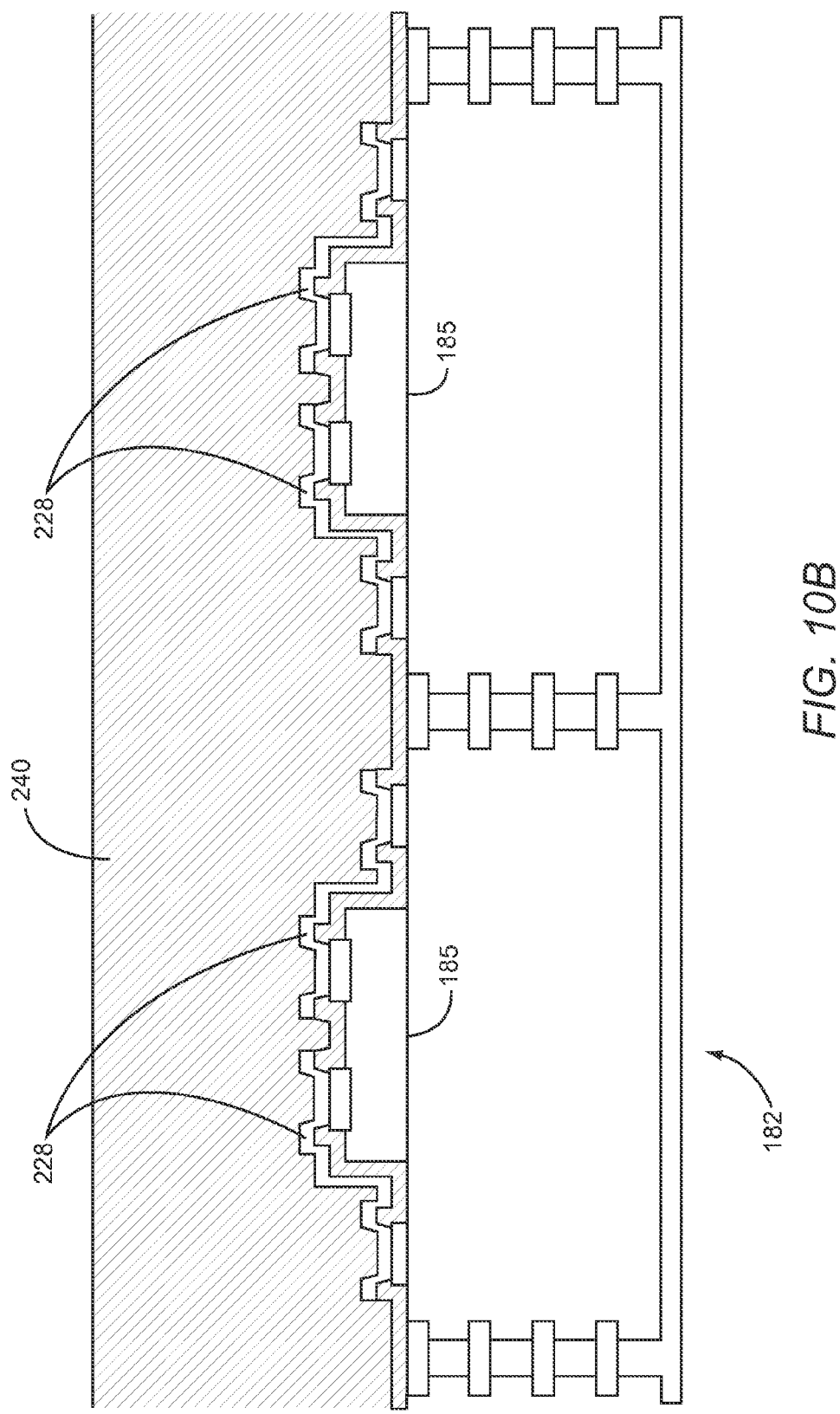
Figure 10C:
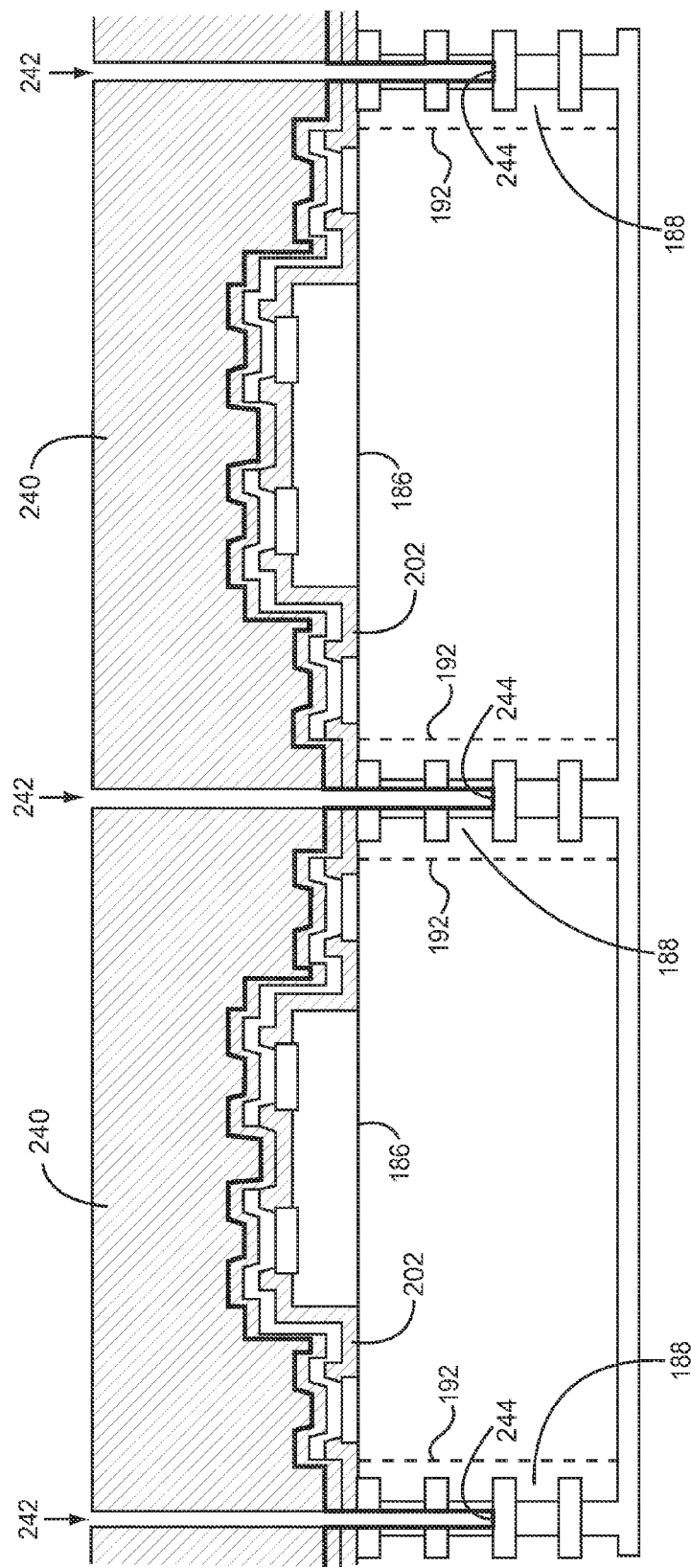
Figure 10D:
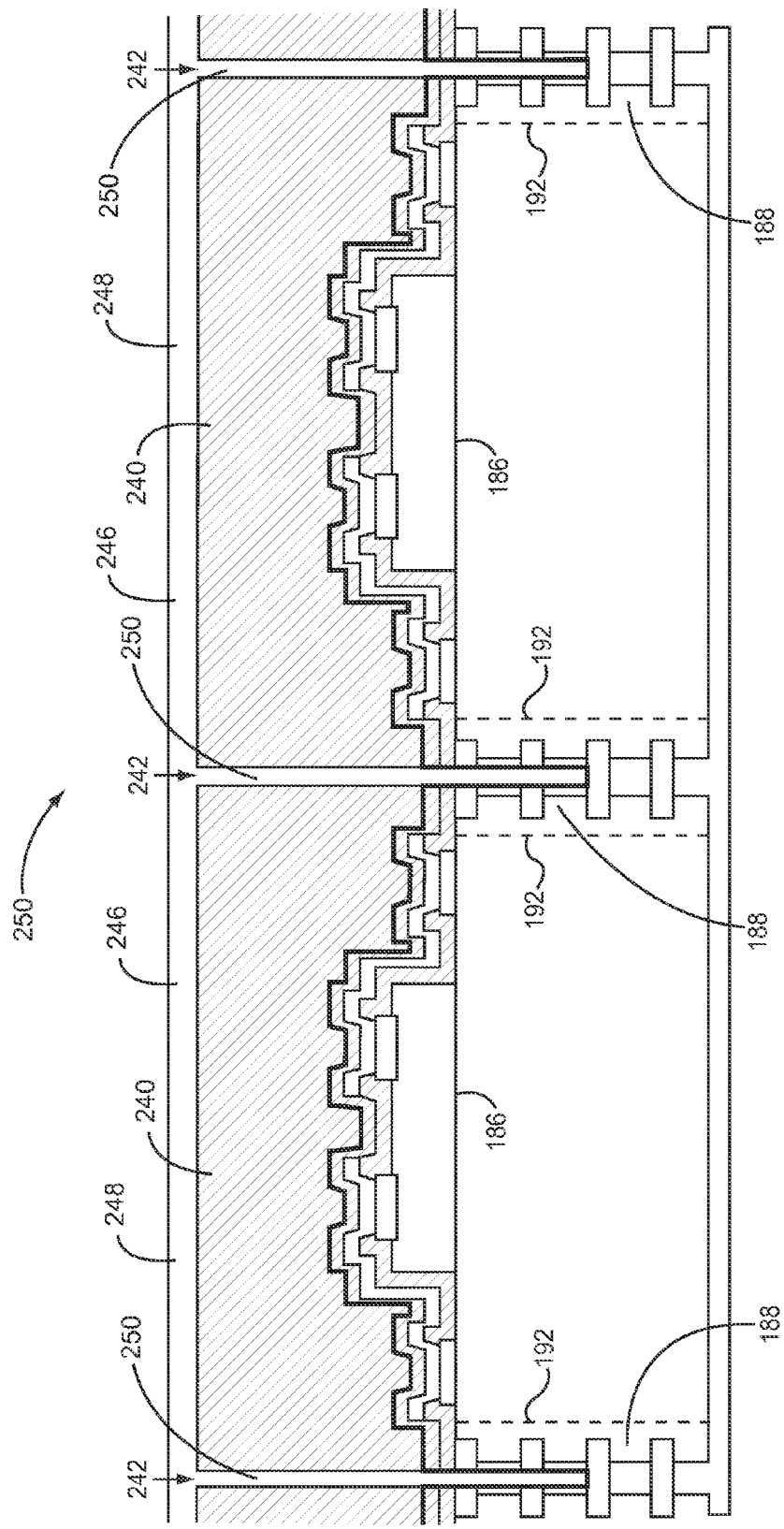
Figure 10E:
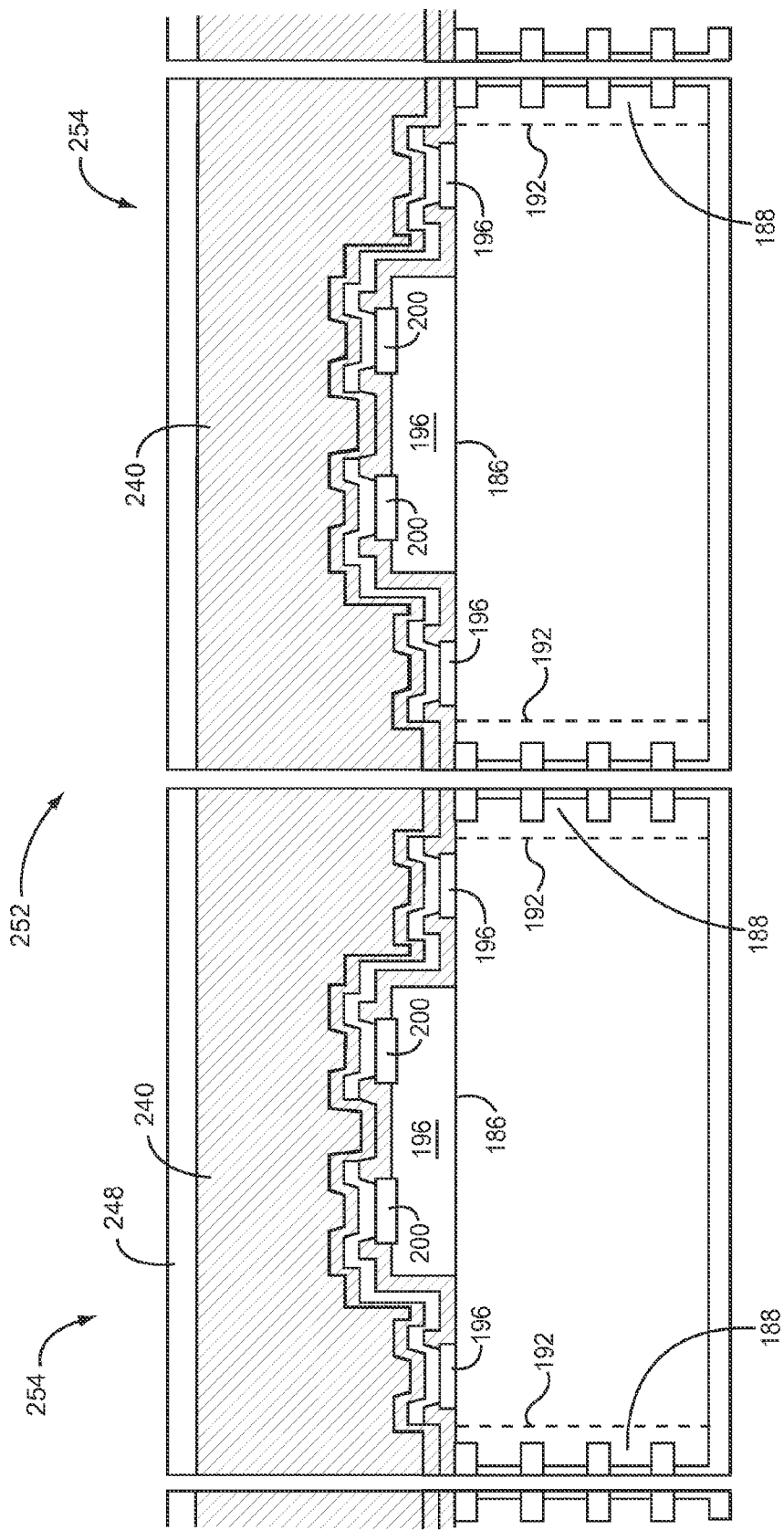

FIGS. 10A-10E illustrate steps for manufacturing yet another embodiment of an electronic meta-module. In FIG. 10A, the substrate 182 is shown after the conductive layer 226 has been shaped to form the traces 228 in accordance with the steps described above for FIGS. 9A-9I. Next, a second insulating layer 240 is provided over the first insulating layer 202 of each of the component areas 186 (FIG. 10B). The second insulating layer 240 should be provided to at least cover the traces 228. The second insulating layer 240 thus electromagnetically isolates the traces 228 to reduce or eliminate electromagnetic interference. In this embodiment, the second insulating layer 240 is an overmold formed over the entire surface 185 of the substrate 182. Channels 242 may then be cut through at least the second insulating layer 240 (FIG. 10C). In this example, the channels 242 expose a section of each metallic structure 188. An electromagnetic shielding material is then applied over the second insulating layer 240, the first insulating layer 202, and within the channels 242 to form electromagnetic shields 246 over the component areas 186 (FIG. 10D). These electromagnetic shields 246 have top portions 248, which cover the component areas 186, and lateral portions 250 that extend within the channels 242 and attach the electromagnetic shields 246 to the exposed section of the metallic structures 188. Electronic meta-module 252 may then be singulated to form individual electronic modules 254 (FIG. 10E).

Note that the second insulating layer 230 in the electronic modules 178 shown in FIG. 9P may be around 10 micrometer to 50 micrometers in thickness, while the second insulating layer 240 in the electronic modules 254 of FIG. 10E are around 50 micrometers to 100 micrometers in thickness. While the second insulating layer 230 in the electronic modules 178 may be thinner, the second insulating layer 240 is thicker and provides additional isolation. However, in either case, the conductive layer 226 in both embodiments is spatially efficient, which allows for the second insulating layer 230 of the electronic module 176 and the second insulating layer 240 of the electronic module 254 to be formed without needing significant increases in thickness above the electronic components 198 to isolate the connections between the conductive pads 196 on the component area 186 and the conductive pads 200 on the electronic components 198.

Those skilled in the art will recognize improvements and modifications to the preferred embodiments of the present disclosure. All such improvements and modifications are considered within the scope of the concepts disclosed herein and the claims that follow.

What is claimed is:

1. A method of manufacturing an electronic module, comprising:
    providing a substrate having a component area on a surface of the substrate and a first conductive pad on the component area;
    attaching an electronic component to the component area, the electronic component having a second conductive pad;
    providing a first insulating layer over the component area that covers at least the electronic component and the first conductive pad;
    exposing at least a first section of the first conductive pad and at least a second section of the second conductive pad through the first insulating layer;
    providing a conductive layer over the first insulating layer and on at least the first section of the first conductive pad and at least the second section of the second conductive pad such that the conductive layer electrically couples the first conductive pad and the second conductive pad;
    providing a second insulating layer over the first insulating layer such that the second insulating layer at least covers the conductive layer; and
    applying an electromagnetic shielding material over the second insulating layer and the first insulating layer to form an electromagnetic shield over the component area.

2. The method of claim 1 wherein the first insulating layer comprises a first dry film.

3. The method of claim 2, further comprising:
    wherein providing the first insulating layer over the component area that covers at least the electronic component and the first conductive pad comprises applying the first dry film over the surface to cover at least the component area; and
    wherein exposing at least the first section of the first conductive pad and at least the second section of the second conductive pad through the first insulating layer comprises:
        applying a first mask on the first dry film having a first opening directly above at least the first section of the first conductive pad and a second opening directly above at least the second section of the second conductive pad; and
        plasma etching the first dry film through the first mask to expose at least the first section of the first conductive pad and at least the second section of the second conductive pad.

4. The method of claim 3, wherein the first dry film is made of an insulating material selected from a group consisting of a silicon oxide, a silicon nitride, and a silicon phosphide.

5. The method of claim 2, wherein the second insulating layer comprises a second dry film.

6. The method of claim 5, wherein providing the second insulating layer over the component area that at least covers the conductive layer comprises:
    applying the second dry film over to cover at least the component area;
    applying a second mask on the second dry film to shape the second dry film; and
    plasma etching the second dry film.

7. The method of claim 1, wherein the substrate further comprises a grounding element positioned along a periphery of the component area and wherein applying the electromagnetic shielding material over the second insulating layer and the first insulating layer to form the electromagnetic shield over the component area comprises applying the electromagnetic shielding material so that the electromagnetic shield covers the component area and is attached to at least a section of the grounding element.

8. The method of claim 1, wherein the second insulating layer comprises an overmold.

9. The method of claim 8, wherein providing the substrate having the component area on the surface of the substrate comprises providing the substrate to have a substrate body that defines a component portion which includes the component area on the surface of the substrate, wherein the substrate further comprises a metallic structure that extends along a periphery of the component portion.

10. The method of claim 9, wherein providing the second insulating layer over the surface that at least covers the conductive layer comprises:
    providing the overmold over the surface to cover the component area; and
    forming an opening through at least the overmold along the periphery of the component portion, wherein the opening exposes at least a section of the metallic structure.

11. The method of claim 10, applying the electromagnetic shielding material over the second insulating layer and the first insulating layer to form the electromagnetic shield over the component area comprises applying the electromagnetic shielding material over the overmold and within the opening to form the electromagnetic shield over the component area that is attached to at least the section of the metallic structure along the periphery of the component portion.

12. The method of claim 1, providing the conductive layer over the first insulating layer and onto at least the first section of the first conductive pad and at least the second section of the second conductive pad such that the conductive layer electrically couples the first conductive pad and the second conductive pad comprises:
    attaching a conductive seed layer over the component area;
    electroplating the conductive seed layer with a conductive material to form the conductive layer;
    providing a mask over the conductive layer configured to shape the conductive layer; and
    plasma etching the conductive layer through the mask so that the conductive layer forms a trace that extends between the first conductive pad and the second conductive pad and is attached to at least the first section of the first conductive pad and at least the second section of the second conductive pad.

13. A method of manufacturing a plurality of electronic modules, comprising:
providing a substrate having a plurality of component areas on a surface of the substrate, each of the plurality of component areas including a first conductive pad;
providing an electronic component on each of the plurality of component areas wherein the electronic component on each of the plurality of component areas includes a second conductive pad;
providing a first insulating layer over each of the plurality of component areas that covers at least the first conductive pad and the electronic component;
exposing at least a first section of the first conductive pad on each of the plurality of component areas and a second section of the second conductive pad of the electronic component on each of the plurality of component areas through the first insulating layer;
providing, for each of the plurality of component areas, a conductive layer over the first insulating layer and onto at least the first section of the first conductive pad and at least the second section of the second conductive pad such that the conductive layer electrically couples the first conductive pad and the second conductive pad;
providing a second insulating layer over each of the plurality of component areas that at least covers the conductive layer; and
applying an electromagnetic shielding material over the second insulating layer and the first insulating layer of each of the plurality of component areas to form an electromagnetic shield over each of the plurality of component areas.

14. The method of claim 13 wherein the first insulating layer comprises a first dry film.

15. The method of claim 14, wherein:
providing the first insulating layer over each of the plurality of component areas that covers at least the first conductive pad and the electronic component comprising:
applying the first dry film over each of the plurality of component areas to cover the plurality of component areas; and
exposing at least the first section of the first conductive pad and at least the second section of the second conductive pad through the first insulating layer comprising:
applying a first mask over each of the plurality of component areas on the first dry film, wherein the first mask has a first opening directly above at least the first section of the first conductive pad on each of the plurality of component areas and a second opening that is directly above at least the second section of the second conductive pad of the electronic component of each of the plurality of component areas; and
plasma etching the first dry film through the first mask to expose at least the first section of the first conductive pad for the electronic component on each of the plurality of component areas and at least the second section of the second conductive pad on each of the plurality of component areas.

16. The method of claim 14, wherein the second insulating layer comprises a second dry film.

17. The method of claim 13, wherein the substrate further comprises a grounding element positioned along a periphery of each of the plurality of component areas and wherein applying the electromagnetic shielding material over the second insulating layer and the first insulating layer of each of the plurality of component areas to form the electromagnetic shield over each of the plurality of component areas further comprises applying the electromagnetic shielding material so that the electromagnetic shield over each of the plurality of component areas is attached to at least a section of the grounding element positioned along the periphery of each of the plurality of component areas.

18. The method of claim 13, wherein the second insulating layer comprises an overmold.

19. The method of claim 18, wherein providing the substrate having the plurality of component areas on the surface of the substrate comprises providing the substrate having a substrate body that includes a plurality of component portions and a plurality of metallic structures that each extend along a periphery of one of the plurality of component portions, wherein each of the plurality of component portions has one of the plurality of component areas on the surface of the substrate.

20. The method of claim 19, wherein providing the second insulating layer over each of the plurality of component areas comprises:
providing the overmold such that the overmold covers at least each of the plurality of component areas; and
forming channels through at least the overmold that expose at least a section of each of the plurality of metallic structures.

21. The method of claim 20, wherein applying the electromagnetic shielding material over the second insulating layer and the first insulating layer of each of the component areas to form the electromagnetic shield over each of the plurality of component areas further comprises applying the electromagnetic shielding material within the channels such that the electromagnetic shield over each of the plurality of component areas is attached to at least the section of one of the plurality of metallic structures.

* * * * *